(12) United States Patent
Wang et al.

(10) Patent No.: US 9,093,323 B2
(45) Date of Patent: Jul. 28, 2015

(54) METHODS FOR SELECTIVELY COATING THREE-DIMENSIONAL FEATURES ON A SUBSTRATE

(71) Applicant: Solexel, Inc., Milpitas, CA (US)

(72) Inventors: David Xuan-Qi Wang, Fremont, CA (US); Mehrdad M. Moslehi, Los Altos, CA (US); Somnath Nag, Saratoga, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 13/942,150

(22) Filed: Jul. 15, 2013

(65) Prior Publication Data

US 2014/0127834 A1    May 8, 2014

Related U.S. Application Data

(63) Continuation of application No. 12/193,415, filed on Aug. 18, 2008, now Pat. No. 8,512,581, which is a continuation-in-part of application No. 11/868,489, filed on Oct. 6, 2007, now abandoned.

(60) Provisional application No. 60/956,388, filed on Aug. 17, 2007, provisional application No. 60/828,678, filed on Oct. 9, 2006, provisional application No. 60/886,303, filed on Jan. 24, 2007.

(51) Int. Cl.

| | |
|---|---|
| *B44C 1/22* | (2006.01) |
| *H01L 21/66* | (2006.01) |
| *H01L 21/67* | (2006.01) |
| *H01L 31/0352* | (2006.01) |
| *H01L 31/18* | (2006.01) |
| *H01L 31/20* | (2006.01) |
| *H05K 3/04* | (2006.01) |
| *H05K 3/12* | (2006.01) |
| *H01L 21/02* | (2006.01) |
| *H05K 1/02* | (2006.01) |
| *H05K 3/20* | (2006.01) |
| *H01L 31/046* | (2014.01) |

(52) U.S. Cl.
CPC .......... *H01L 22/12* (2013.01); *H01L 21/02617* (2013.01); *H01L 21/6715* (2013.01); *H01L 31/035281* (2013.01); *H01L 31/1872* (2013.01); *H01L 31/202* (2013.01); *H05K 3/046* (2013.01); *H05K 3/1258* (2013.01); *H01L 31/046* (2014.12); *H05K 1/0284* (2013.01); *H05K 3/207* (2013.01); *H05K 2201/09036* (2013.01); *H05K 2201/09045* (2013.01); *H05K 2203/0126* (2013.01); *H05K 2203/0528* (2013.01); *H05K 2203/308* (2013.01); *Y02E 10/50* (2013.01)

(58) Field of Classification Search
USPC ............. 216/37; 438/249, 458, 409, 960, 689
See application file for complete search history.

(56) References Cited

U.S. PATENT DOCUMENTS

| | | | | |
|---|---|---|---|---|
| 5,148,708 | A * | 9/1992 | Murata et al. | ............... 73/304 R |
| 5,660,680 | A * | 8/1997 | Keller | .............................. 438/50 |
| 6,645,833 | B2 * | 11/2003 | Brendel | ........................ 438/458 |
| 7,511,935 | B2 * | 3/2009 | Nakash | ......................... 361/234 |

* cited by examiner

*Primary Examiner* — Nadine Norton
*Assistant Examiner* — Maki Angadi
(74) *Attorney, Agent, or Firm* — John Wood

(57) ABSTRACT

Methods here disclosed provide for selectively coating three-dimensional features on a substrate while avoiding liquid coating material wicking into micro cavities on the substrates. The steps include depositing a semiconductor layer on a sacrificial layer formed on a template and selectively etching the sacrificial layer. Then, the steps include releasing the semiconductor layer from the template and coating three-dimensional features on the substrate using a liquid coating step for applying a liquid coating material to a pre-determined surface of the three-dimensional features on the substrate.

20 Claims, 29 Drawing Sheets

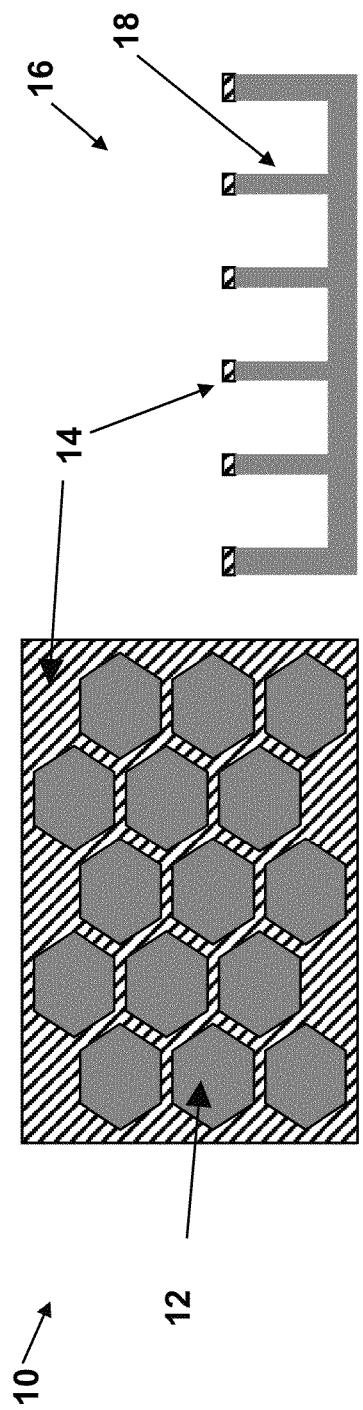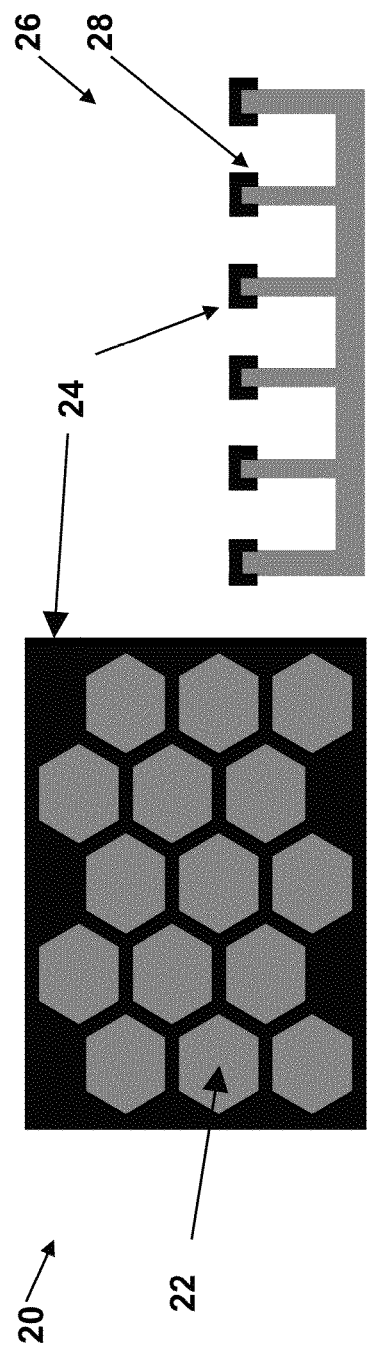

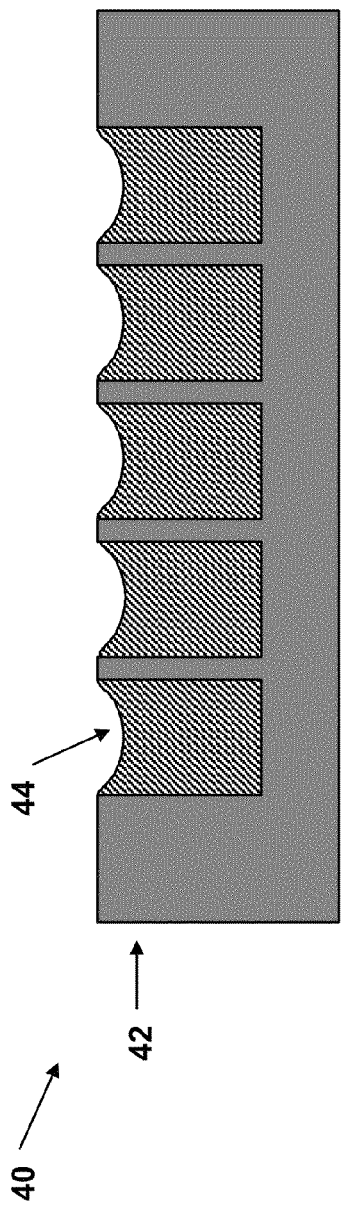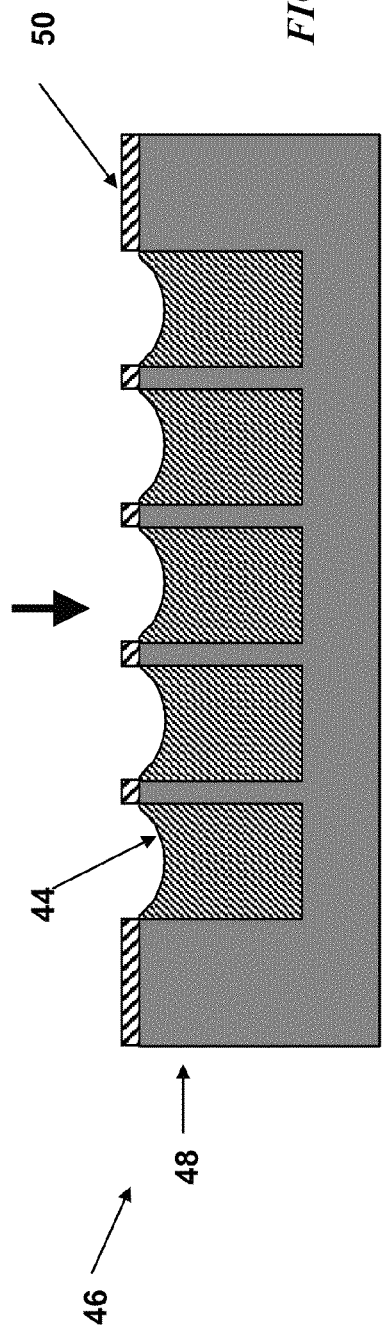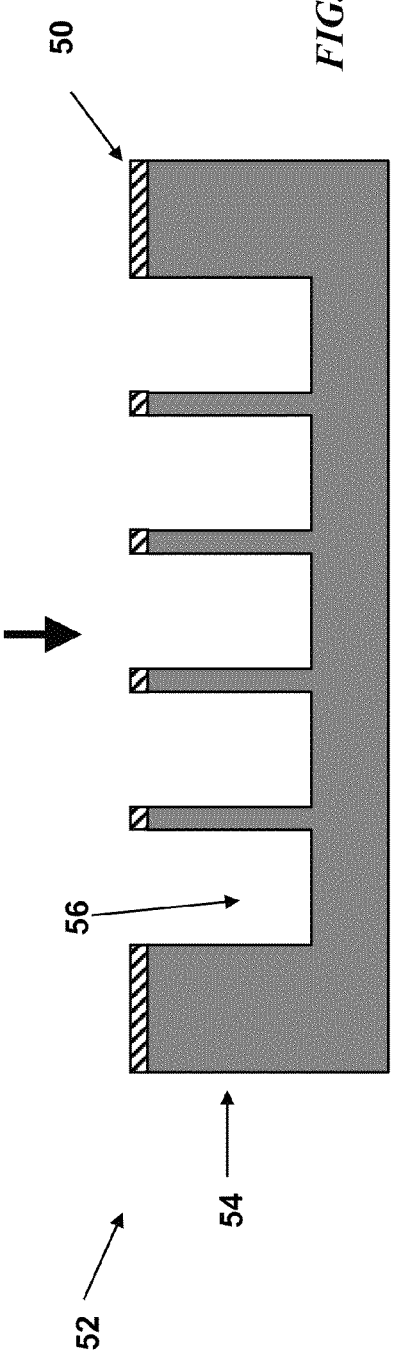

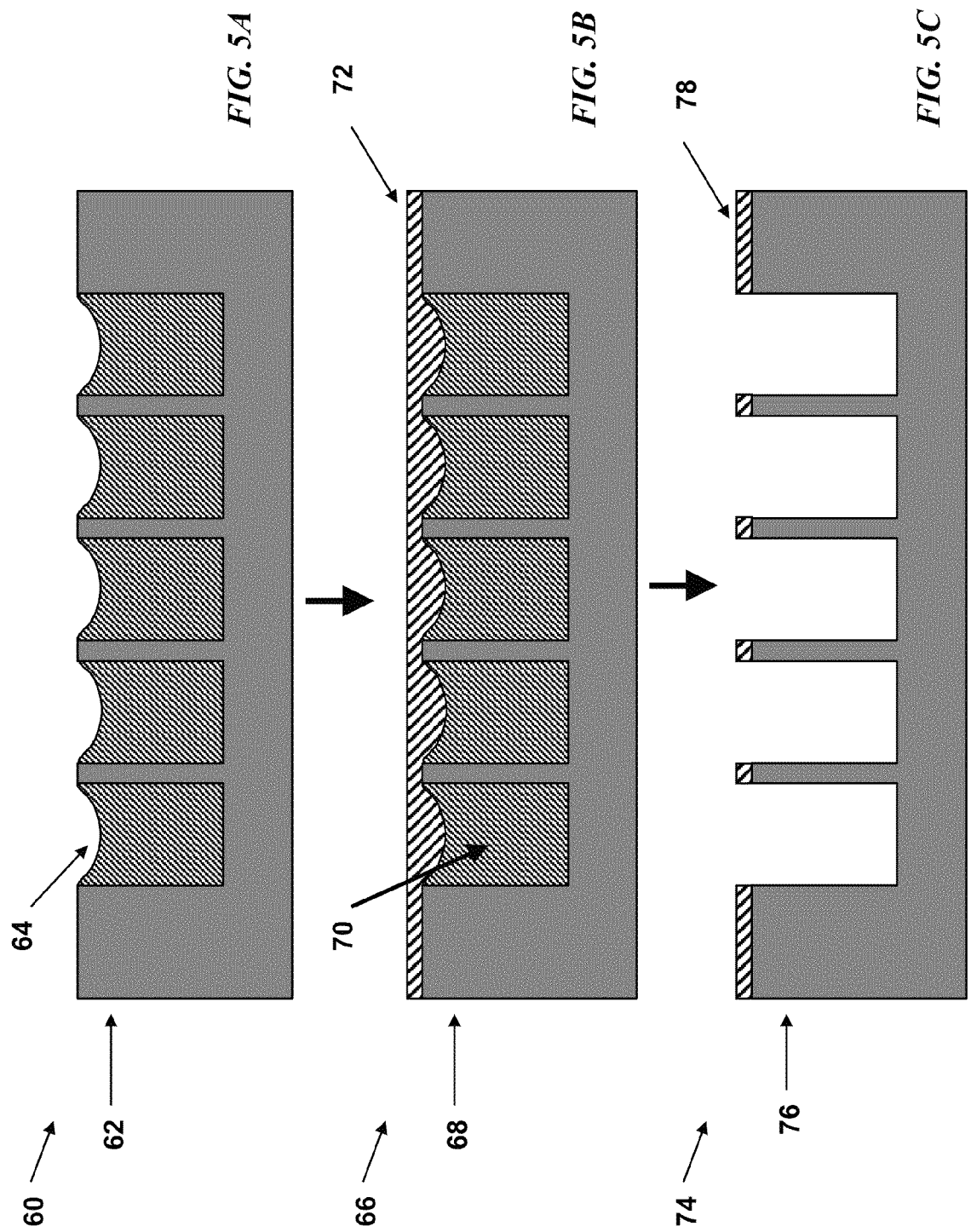

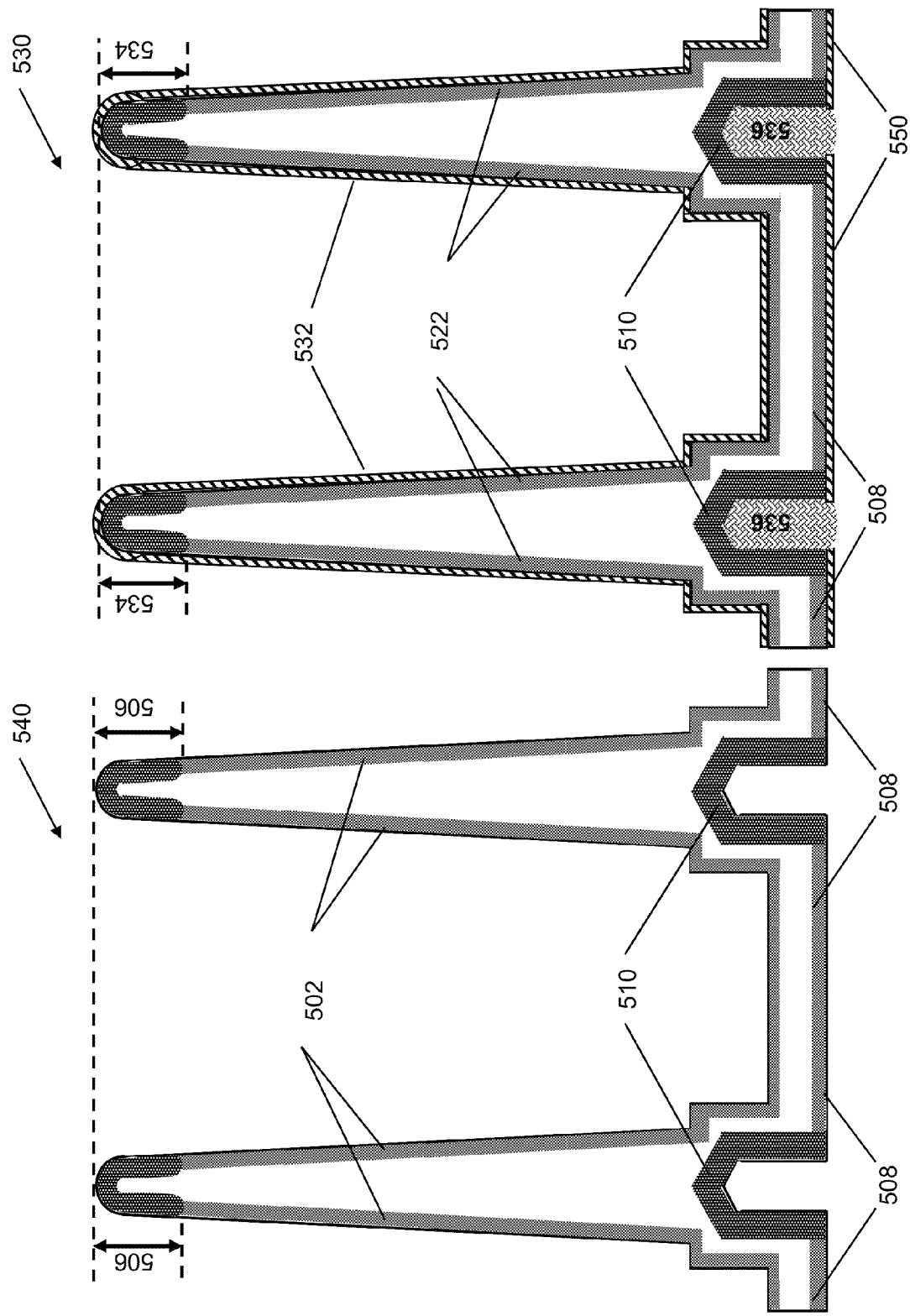

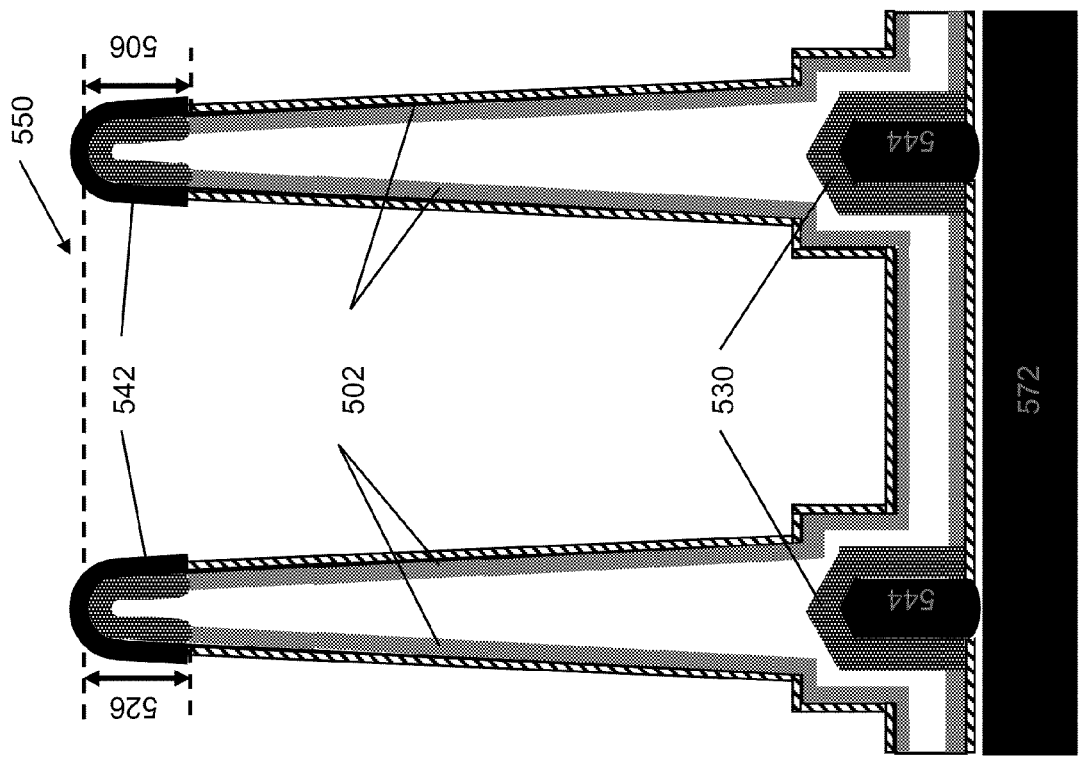
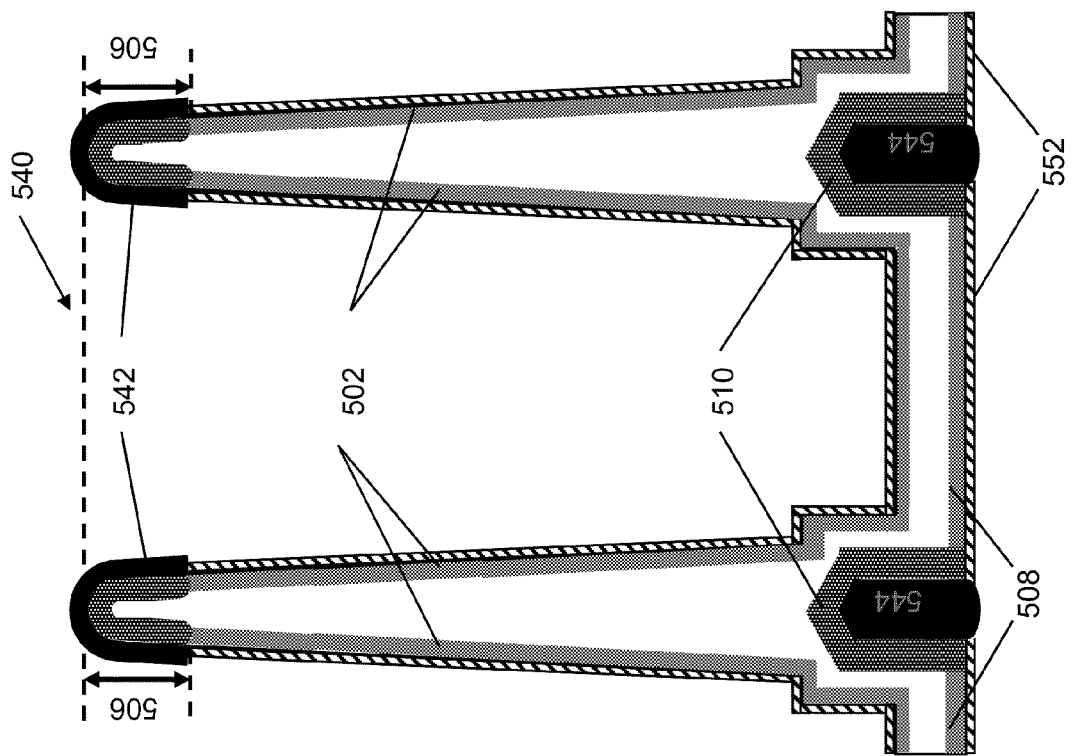

US 9,093,323 B2

METHODS FOR SELECTIVELY COATING THREE-DIMENSIONAL FEATURES ON A SUBSTRATE

This application is a continuation of U.S. patent application Ser. No. 12/193,415 filed on Aug. 8, 2008 which is hereby incorporated by reference in its entirety.

U.S. patent application Ser. No. 12/193,415 claims the benefit of U.S. provisional patent application Ser. No. 60/956,388 filed on Aug. 17, 2007 and is a continuation-in-part of U.S. patent application Ser. No. 11/868,489, all of which are hereby incorporated by reference.

FIELD

This disclosure relates in general to the field of methods for coating three-dimensional (3-D) substrates. And more particularly, the presently disclosed subject matter relates to selectively coating a specially manufactured 3-D substrate with a liquid coating material.

DESCRIPTION OF THE RELATED ART

It is often desirable to form a thin layer of film from a liquid coating material on the top surfaces or ridges of 3-D microstructures on a substrate. An example of such a substrate is a honeycomb-prism silicon substrate with hexagonal-prism sidewalls. Applications of such substrates may include photovoltaic cells (such as three-dimensional thin-film cells), micro-electro-mechanical systems (MEMS), and other semiconductor microelectronic devices.

In the past, the following conventional liquid/paste coating methods have been used to coat flat wafers and substrates: spin coating, spray coating, immersion coating, dip coating, extrusion coating with a slit die, screen/stencil printing/coating, brush/roller coating, jetting, wave front coating, and meniscus coating. However, when the above listed methods are used to coat wafers with 3-D microstructures, the liquid coating material tends to wick into the micro cavities (open spaces of 3-D microstructures) and cover their sidewalls and bottom surfaces due to the existence of external delivering pressure from the liquid coating being applied and capillary forces that are generated within the micro cavities of 3-D micro structures. Thus, the listed conventional coating methods could not provide liquid coating on selective surfaces (top surface or ridges) of 3-D microstructures that is required in many applications.

SUMMARY

The following description is not to be taken in a limiting sense, but is made for the purpose of describing the general principles of the present disclosure. The scope of the present disclosure should be determined with reference to the claims. And although described with reference to the manufacture and coating of three-dimensional thin-film solar substrates (3-D TFSS), a person skilled in the art could apply the principles discussed herein to the manufacture and coating of any multi-dimensional substrate.

The selective coating methods disclosed eliminate the wicking of liquid coating material into micro cavities and the resulting coating of the side and bottom walls of the micro cavities. According to one aspect of the disclosed subject matter, there are provided methods and devices for selectively coating the top surface or top ridges of substrates having 3-D topography features with a liquid coating material.

According to another aspect of the disclosed subject matter, there is a provided method for manufacturing a 3-D TFSS. The method comprises forming a 3-D TFSS using a template. The template comprises a template substrate comprising a plurality of posts and a plurality of trenches between said plurality of posts. The 3-D TFSS is formed by forming a sacrificial layer on the template, subsequently depositing a semiconductor layer, selectively etching the sacrificial layer, and releasing the semiconductor layer from the template. Additionally, throughout the manufacturing process, the present disclosure provides the ability to selectively coat the top surfaces or ridges of the 3-D TFSS substrate.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages be included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein:

FIGS. 1A through 1B show an embodiment of a hexagonal-prism 3-D TFSS selectively coated on its top surface with a liquid coating material;

FIGS. 2A through 2B show an embodiment of a hexagonal-prism 3-D TFSS selectively coated on its top ridges with a liquid coating material;

Figure 3:
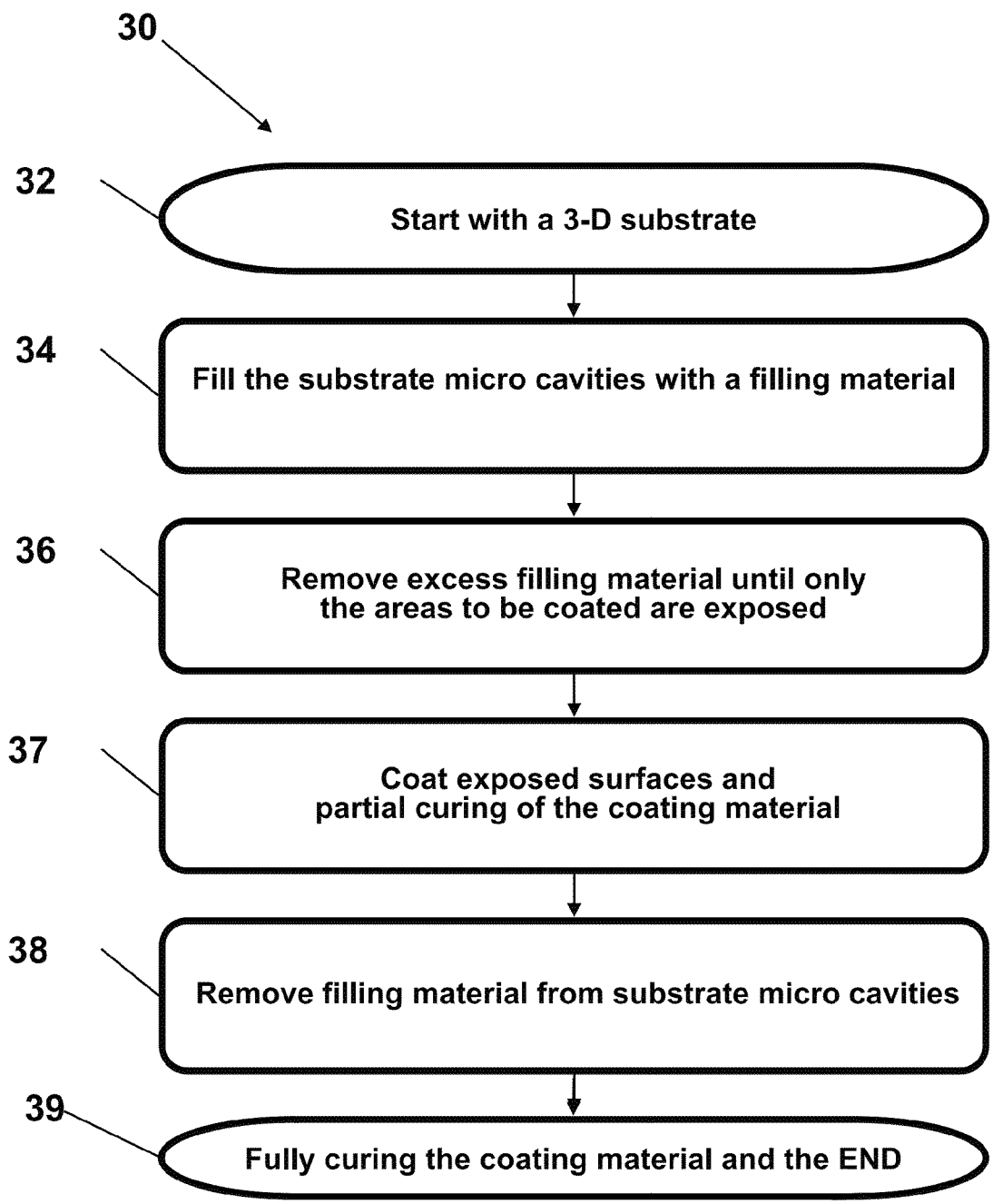
Figure 6:
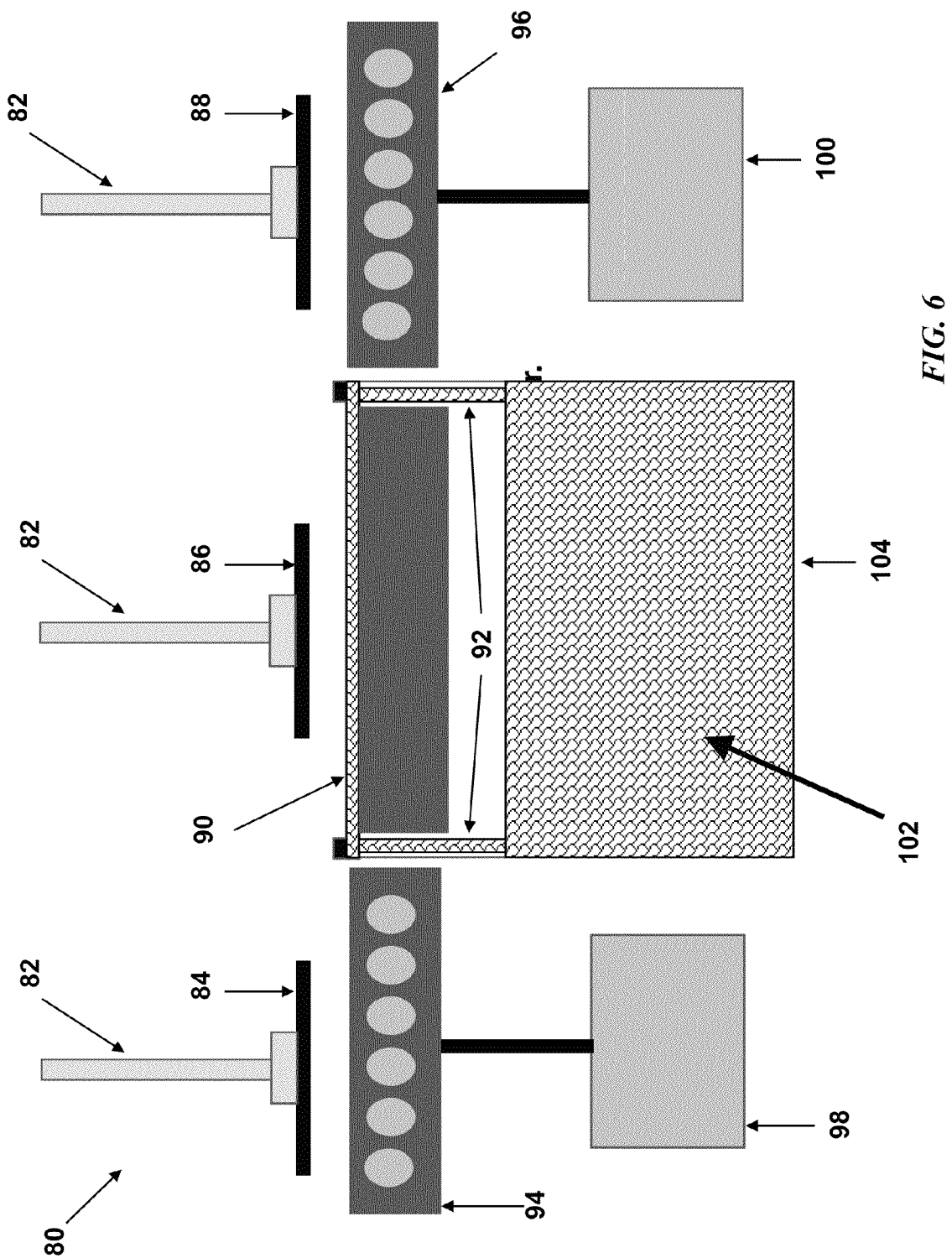
Figure 7:
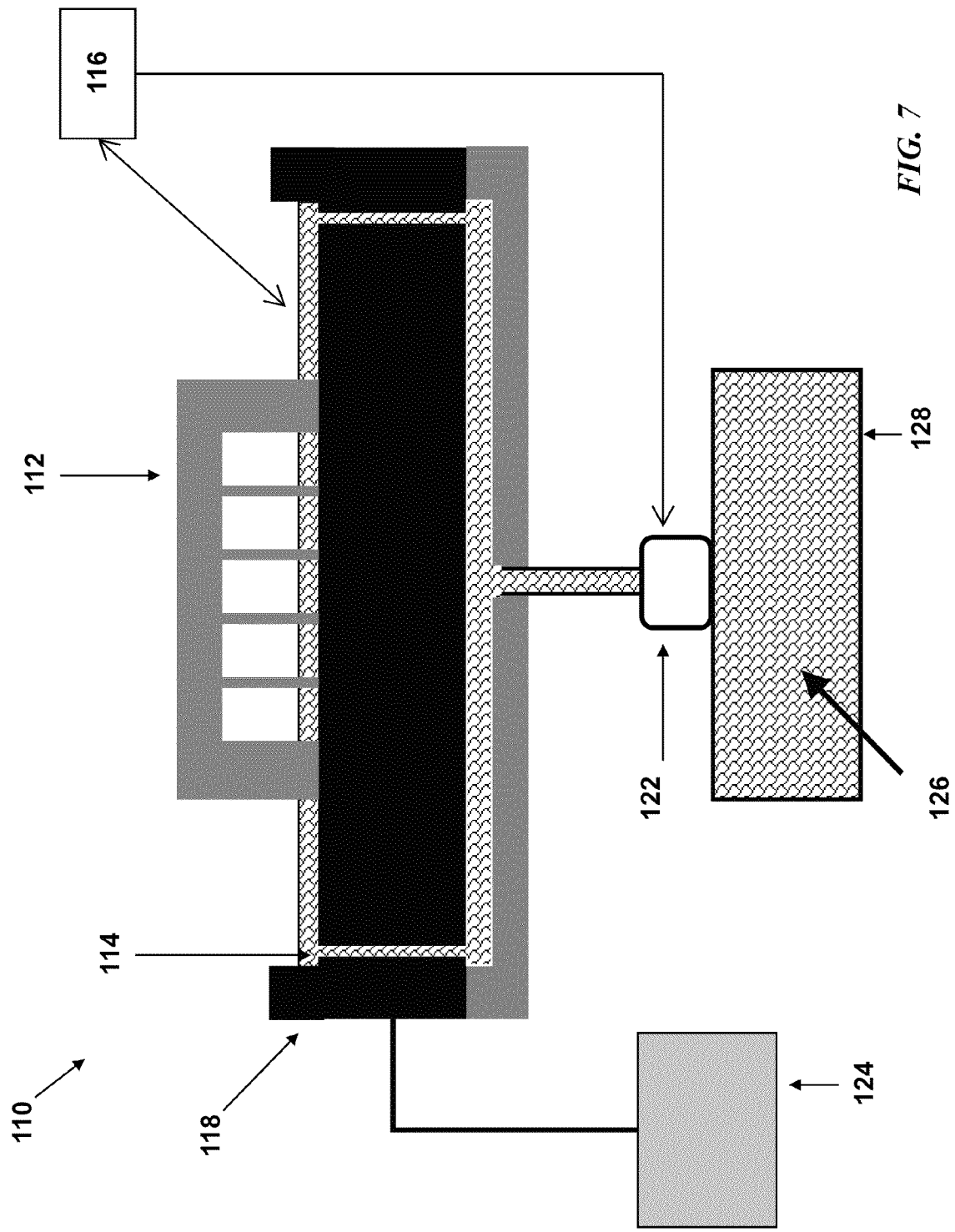
Figure 8:
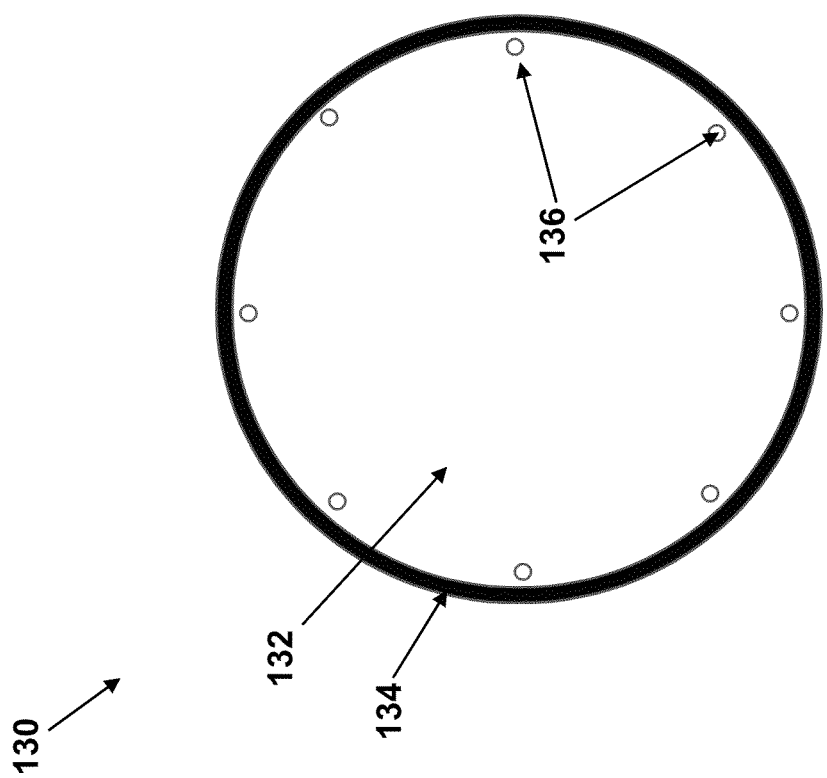
Figure 9:
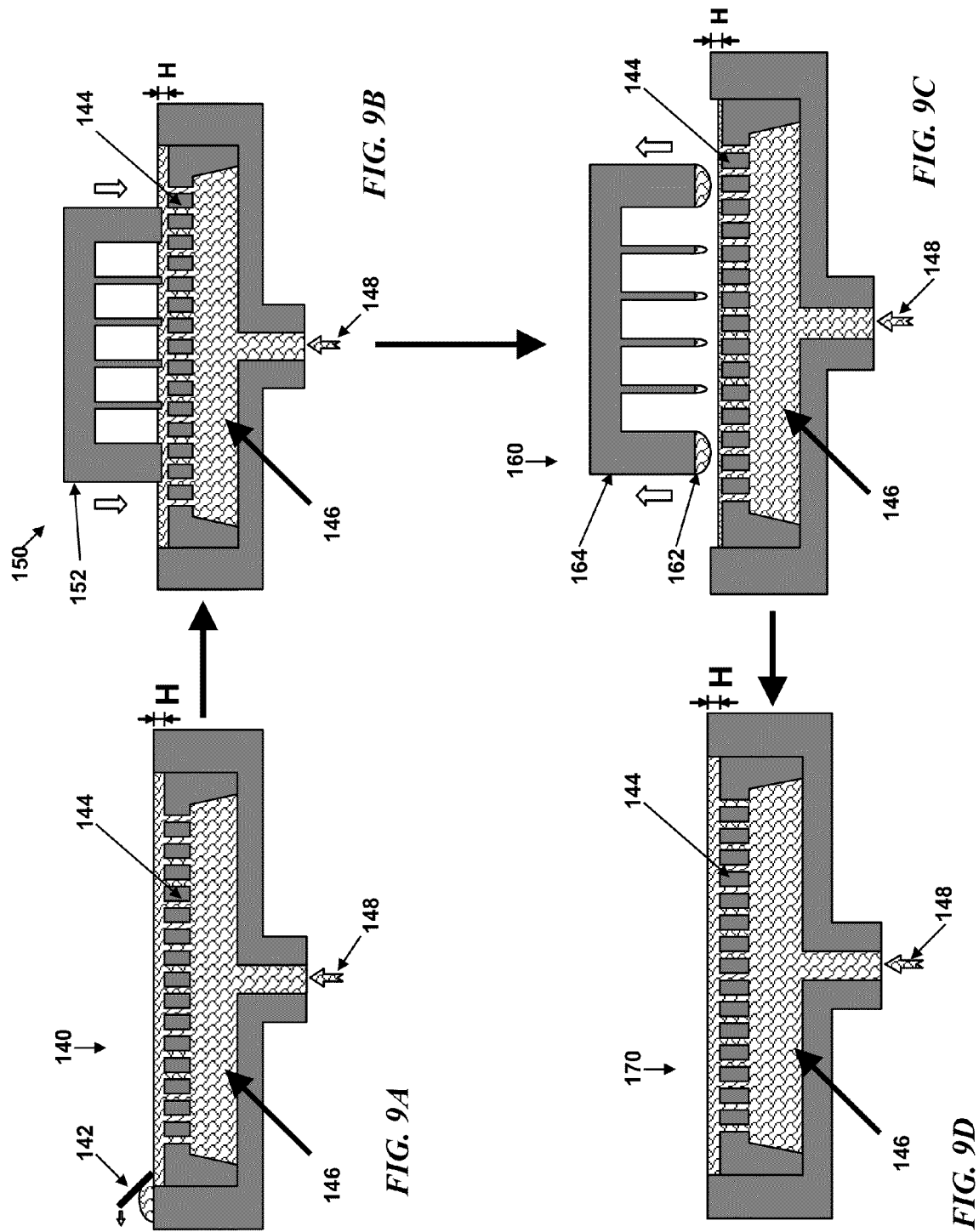
Figure 10:
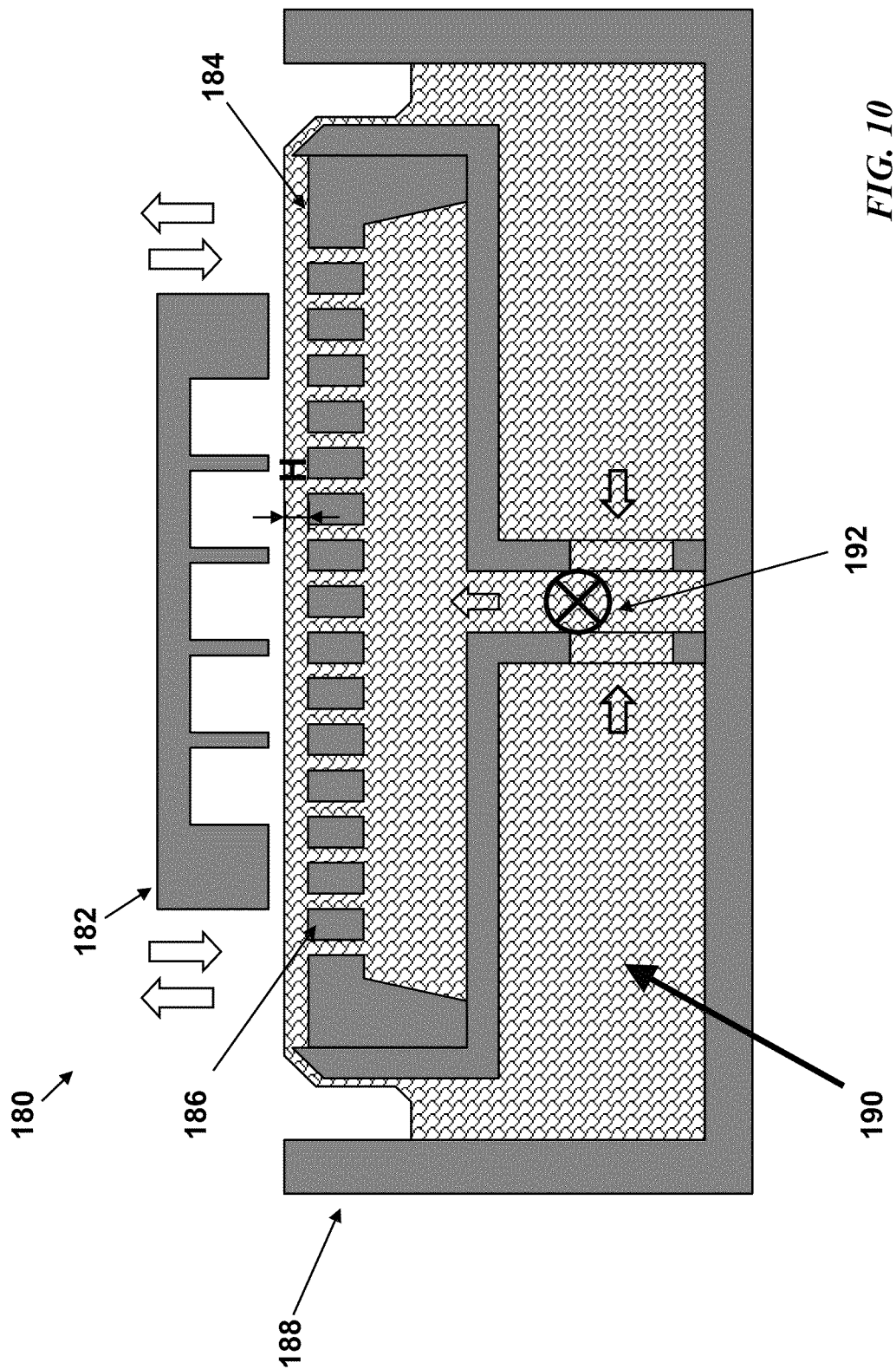
Figure 11:
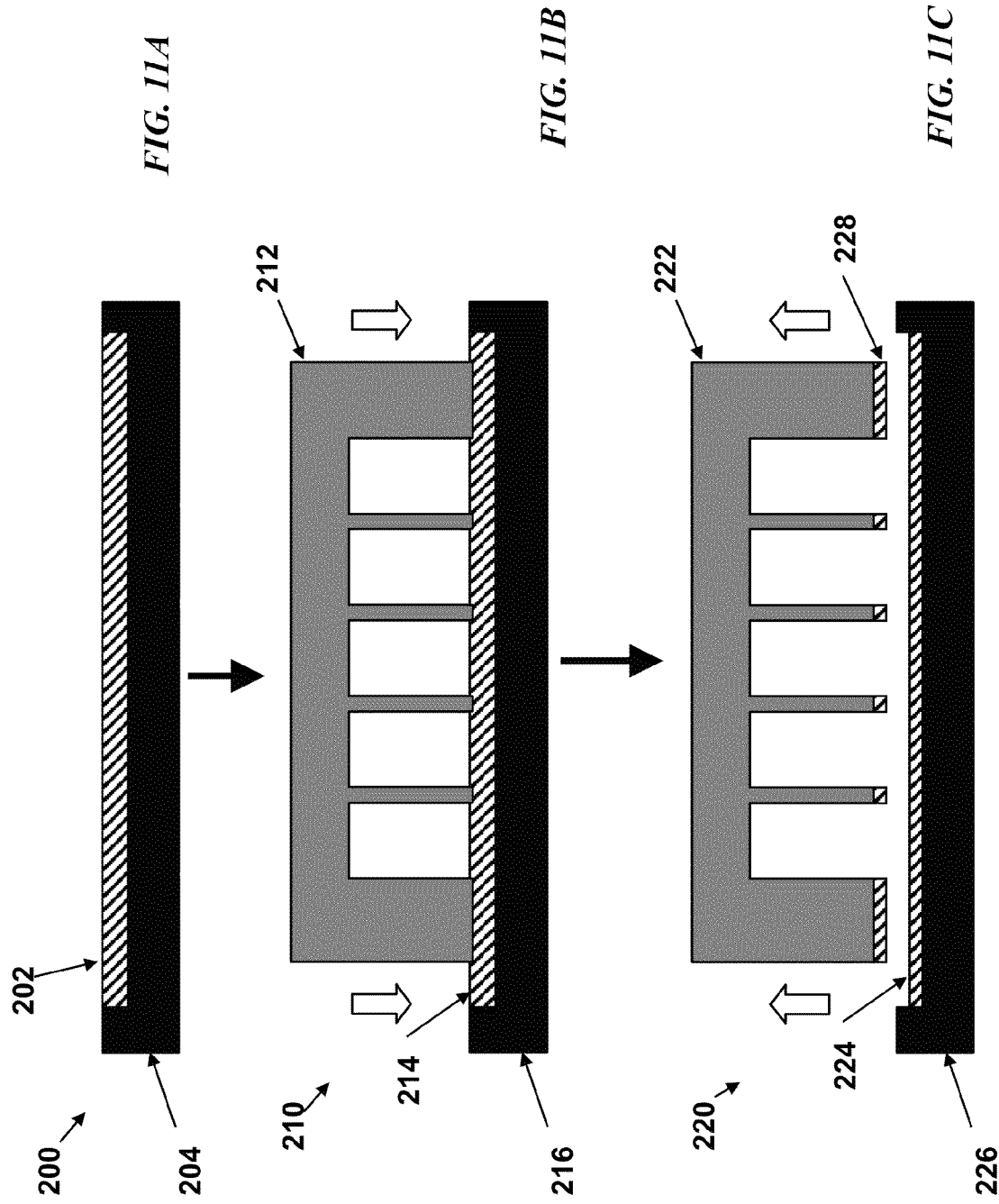
Figure 12:
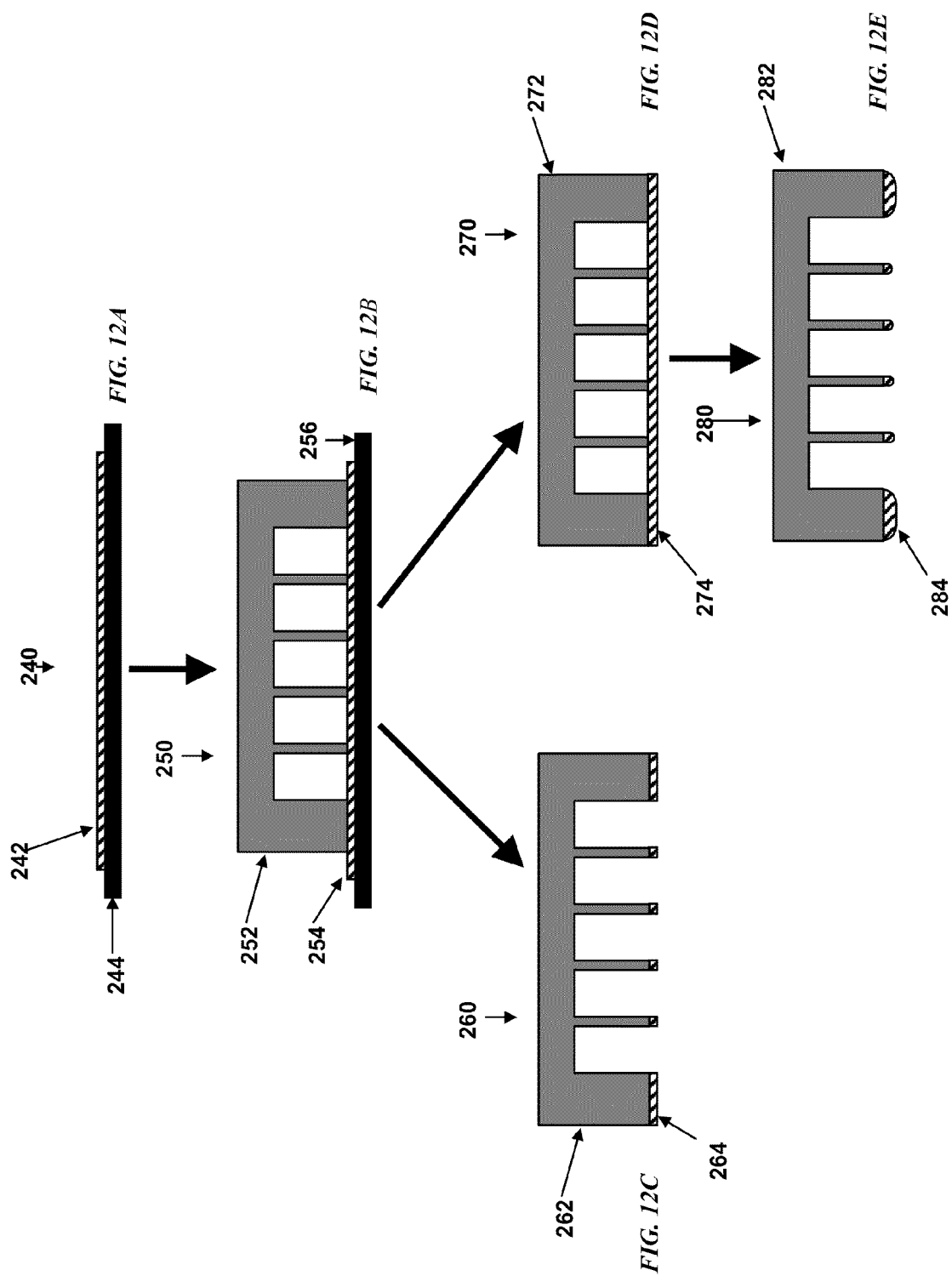
Figure 13:
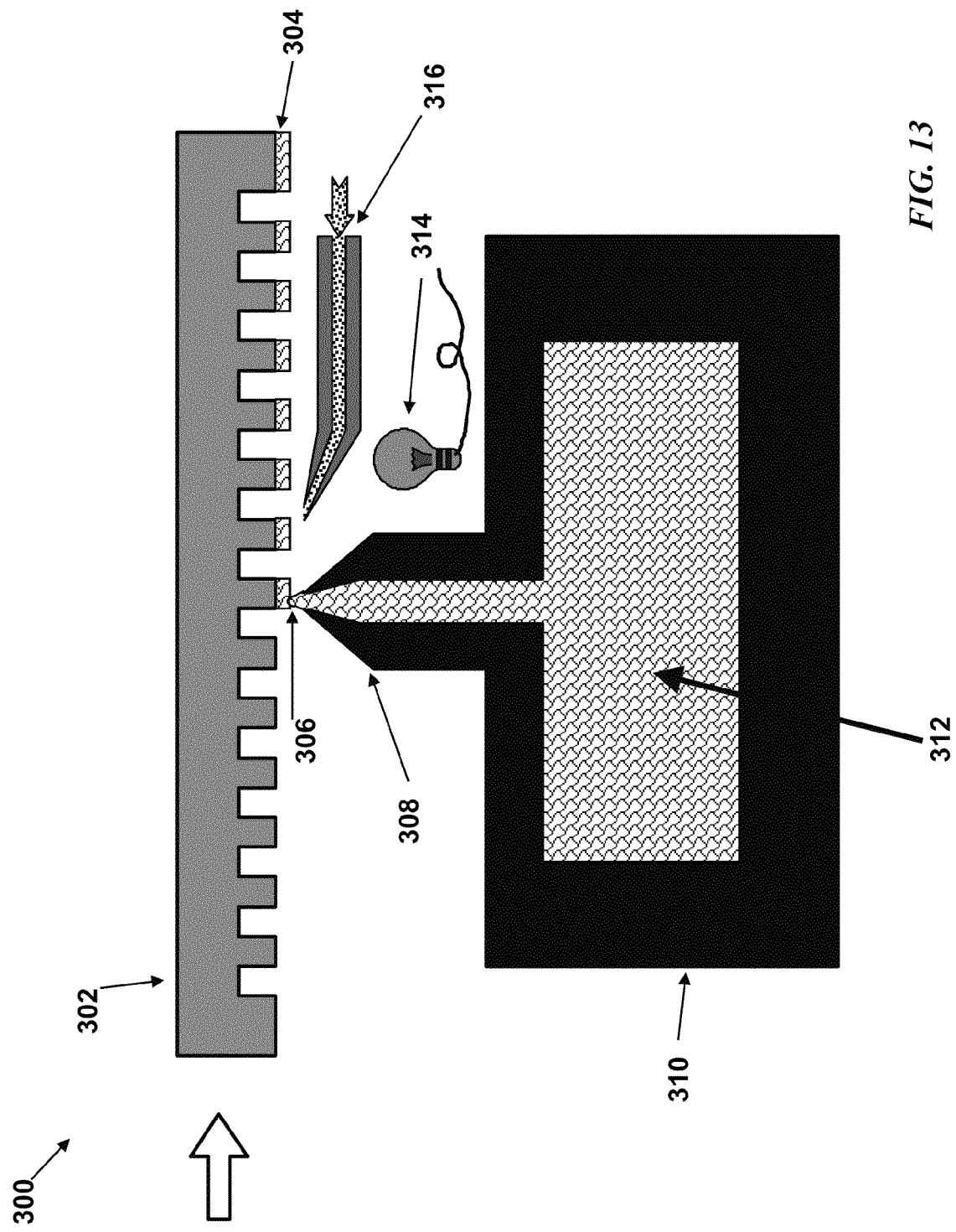
Figure 14:
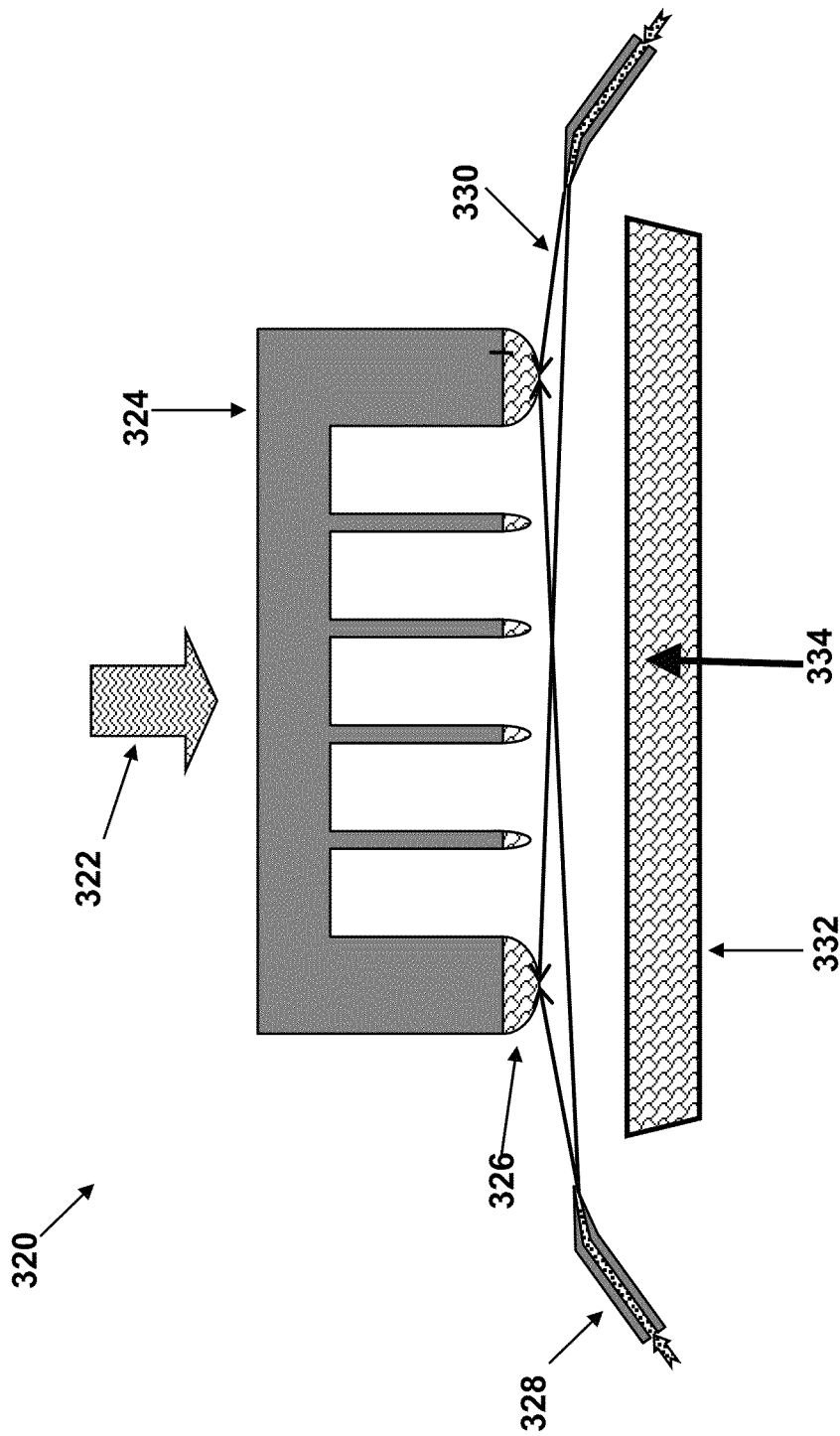
Figure 15:
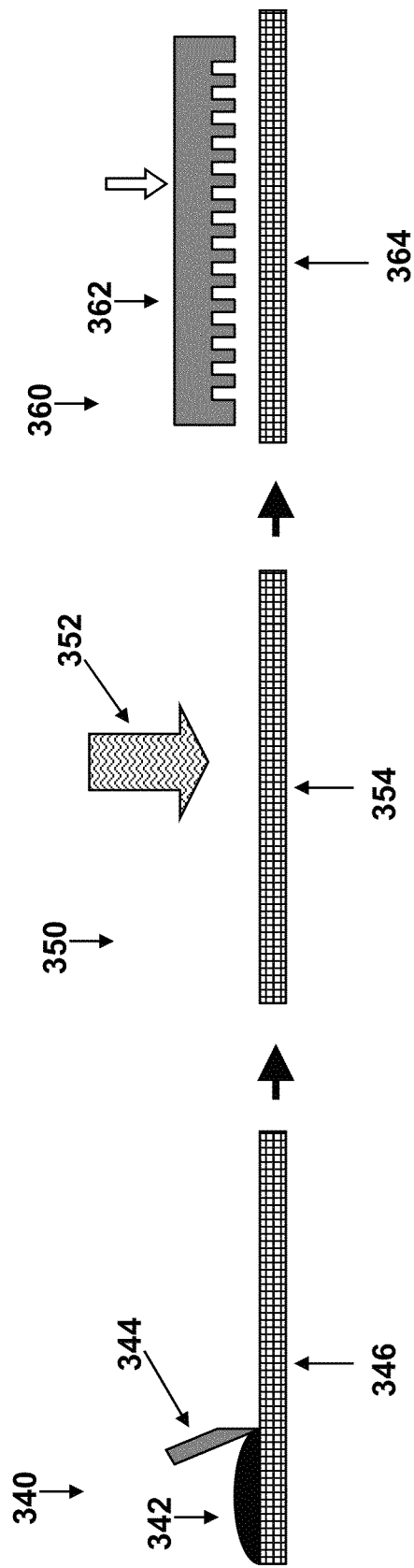
Figure 16:
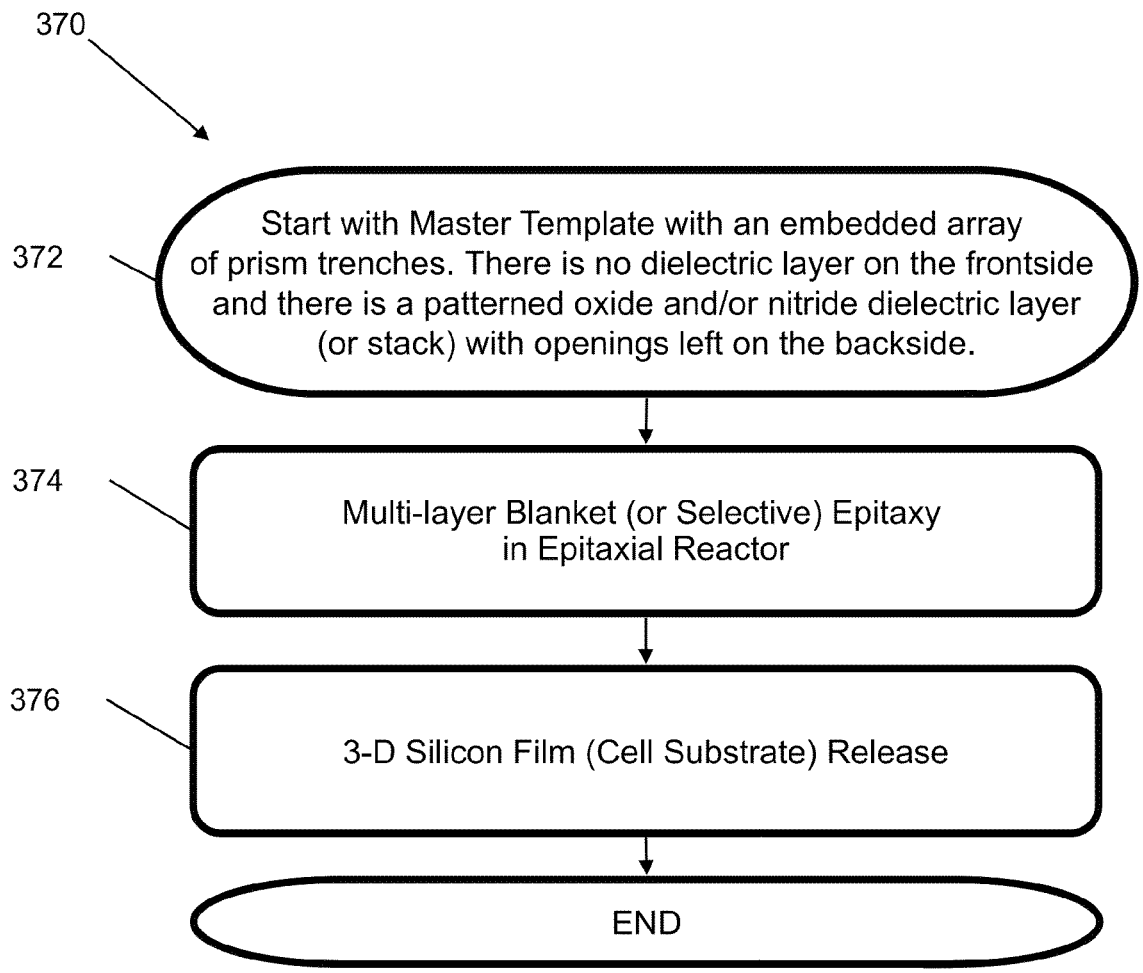
Figure 17:
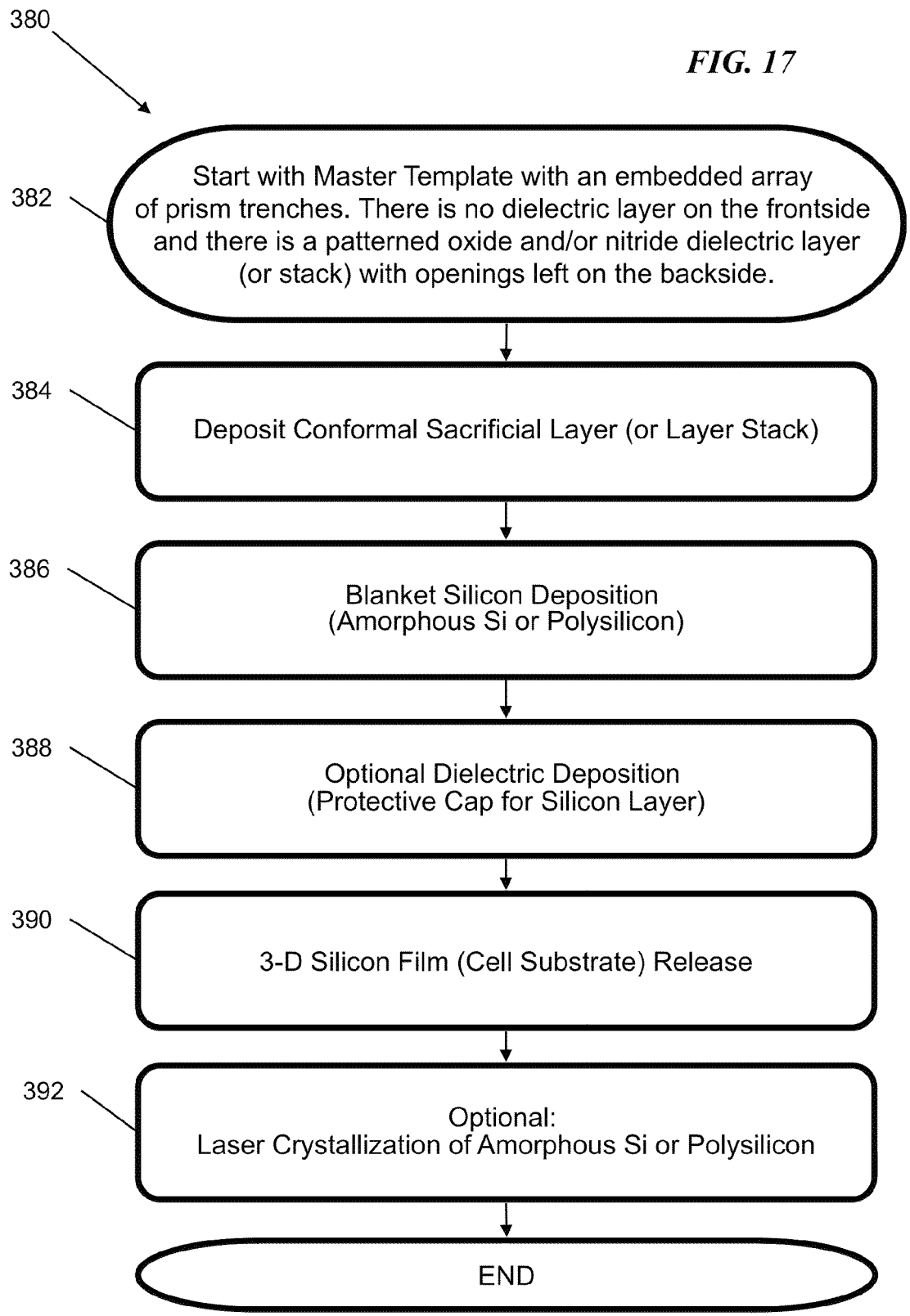
Figure 18:
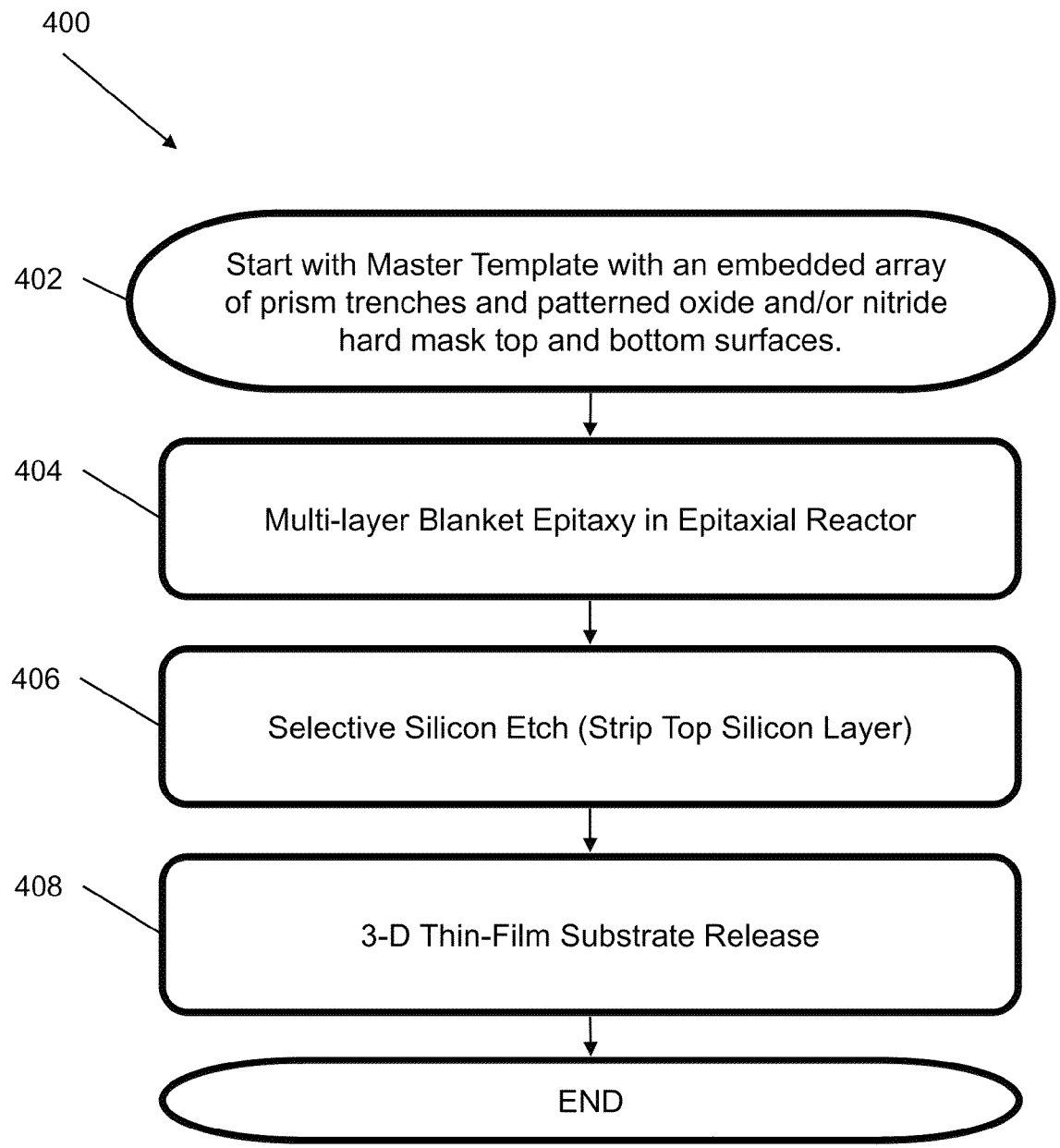
Figure 27:
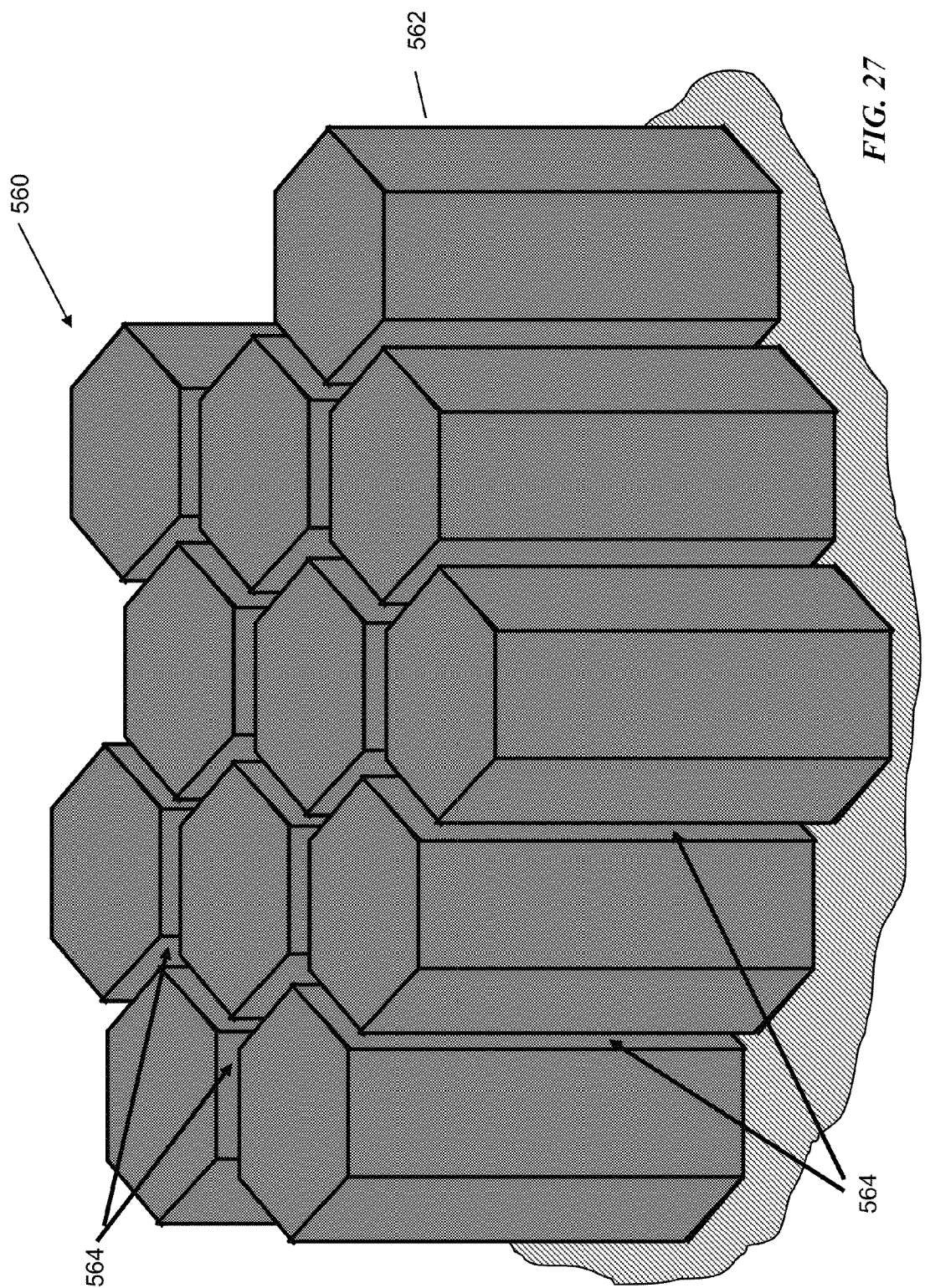
Figure 28:
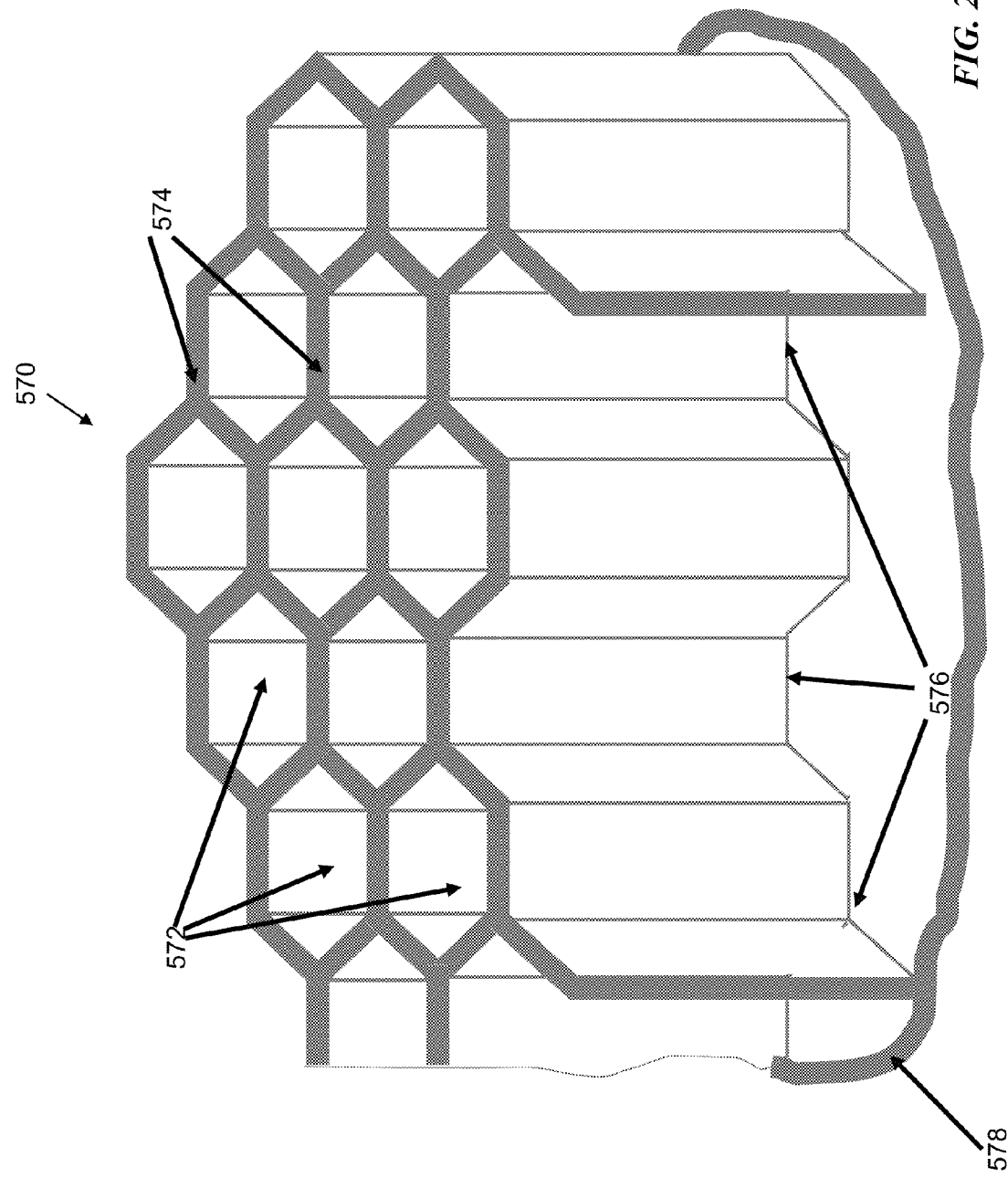
Figure 29:
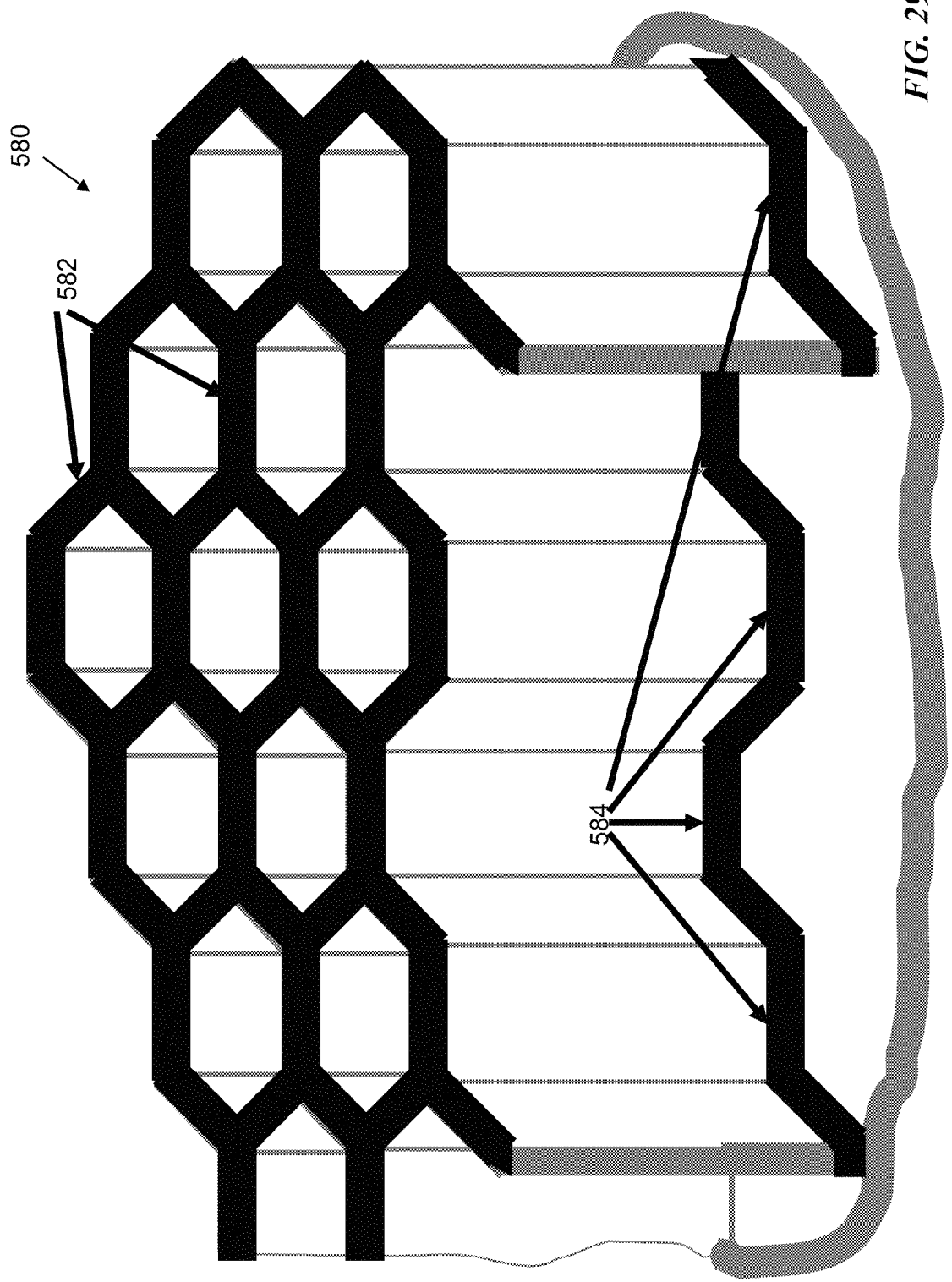
Figure 30B:
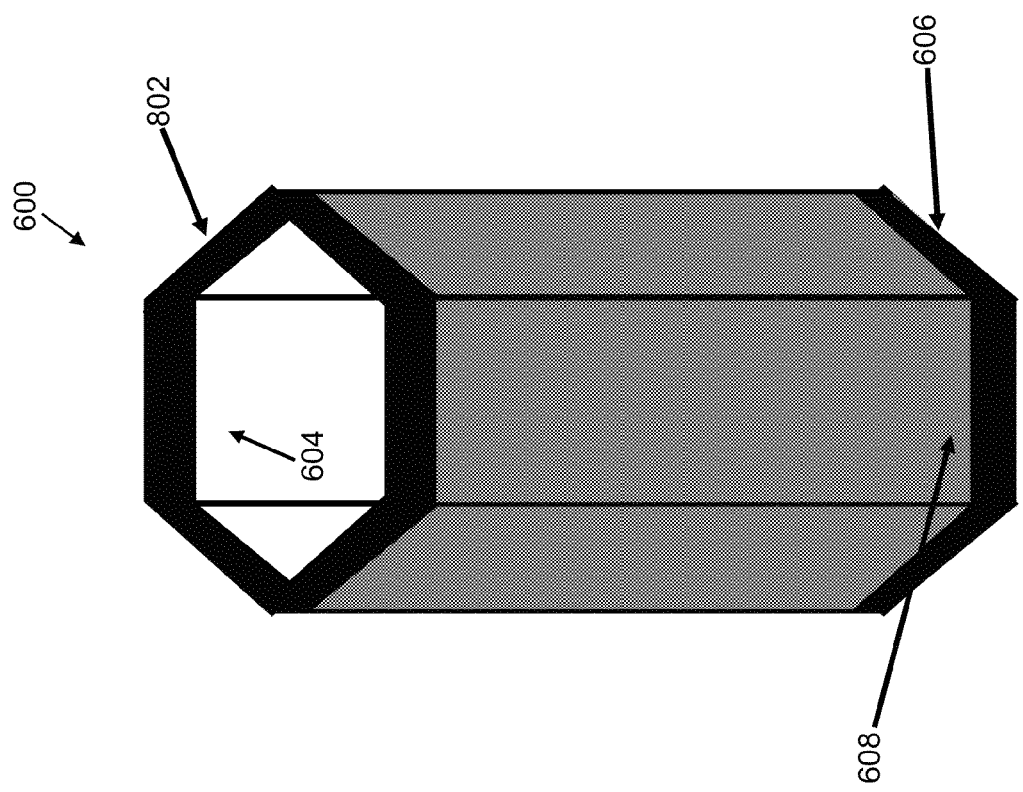
Figure 30A:
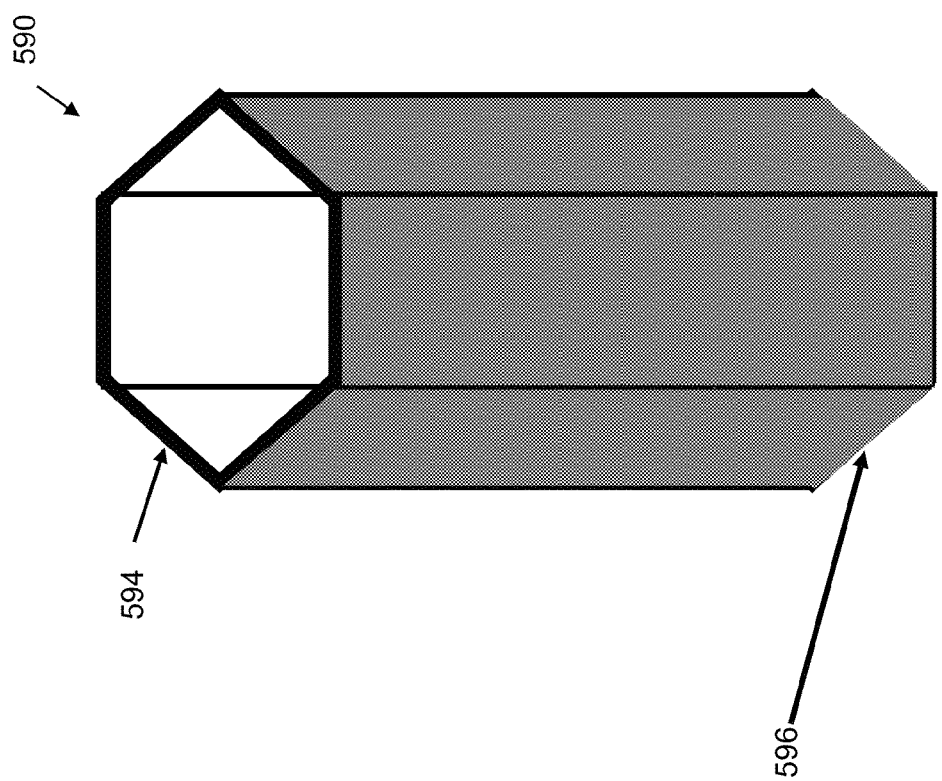

FIG. 3 outlines an embodiment of a process flow for selectively coating a 3-D substrate with a liquid coating material using a cavity filling method;

FIGS. 4A through 4C show an embodiment of a process flow for selectively coating a 3-D substrate with a liquid coating material using a cavity filling method employing a filling material immiscible with the liquid coating material;

FIGS. 5A through 5C show an embodiment of a process flow for selectively coating a 3-D substrate with a liquid coating material using a cavity filling method;

FIG. 6 shows a schematic view of an integrated in-line process system for selectively coating a 3-D substrate with a liquid coating material according to a liquid dip coating process employing a liquid transfer coating head integrated with an electrostatic chuck;

FIG. 7 shows an embodiment of a liquid transfer coating head design integrated with an electrostatic chuck for selectively coating the top ridges of a 3-D substrate;

FIG. 8 shows an embodiment of a liquid transfer coating head having peripheral liquid transfer holes;

FIGS. 9A through 9D show an embodiment of a process flow for selectively coating a 3-D substrate with a liquid coating material using a micromachined plate having restrictive flow holes to restrict the refreshing flow rate of liquid coating material;

FIG. 10 shows an embodiment of a liquid coating system for selectively coating a 3-D substrate with a liquid coating material using a micromachined plate having restrictive flow holes to restrict the refreshing flow rate of liquid coating material;

FIGS. 11A through 11C show an embodiment of a process flow for selectively coating a 3-D substrate with a liquid coating material using a hard transfer template;

FIGS. 12A through 12E show an embodiment of a process flow for selectively coating a 3-D substrate with a liquid coating material using a soft transfer film;

FIG. 13 shows an embodiment of a dual-zone meniscus coating device used for selectively coating a 3-D substrate with a liquid coating material;

FIG. 14 shows an embodiment of an angle spray coating device used for selectively coating a 3-D substrate with a liquid coating material;

FIG. 15 shows a schematic of an integrated in-line process system of a modified screen printing process for selectively coating a 3-D substrate with a liquid coating material;

FIGS. 16 and 17 show alternative embodiments of a process flows for fabrication of self-supporting hexagonal prism 3-D TFSS substrates including rear base layers (single-aperture TFSS substrates with single-aperture unit cells);

FIG. 18 shows an embodiment of a process flow for fabrication of self-supporting hexagonal prism 3-D TFSS substrates using layer release processing;

FIG. 19 through 23 illustrate Y-Y cross-sectional views of a template with within-wafer trenches and no dielectrics on the template frontside, as it goes through the key process steps to fabricate a hexagonal prism 3-D TFSS substrate (single-aperture TFSS substrate) with a rear base layer;

FIGS. 24A through 26B show Y-Y cross-sectional views of a unit cell within an embodiment of a single-aperture hexagonal-prism 3-D TFSS substrate including a rear base layer;

FIG. 27 shows a view of an embodiment of a template including hexagonal prism posts;

FIG. 28 shows a 3-D cross-sectional view of an embodiment of a single-aperture hexagonal-prism 3-D TFSS substrate (i.e., TFSS substrate with an integral base layer), including the substrate rear monolithically (integrally) connected to a substantially flat planar thin semiconductor film;

FIG. 29 shows multiple adjacent hexagonal-prism unit cells, after completion of the TFSS fabrication process and after mounting the cell rear base side onto a rear mirror; and FIGS. 30A and 30B show 3-D views of a single unit cell in a dual-aperture hexagonal-prism 3-D TFSS substrate, before and after self-aligned base and emitter contact metallization, respectively.

DETAILED DESCRIPTION OF THE ILLUSTRATIVE EMBODIMENTS

The following description is not to be taken in a limiting sense, but is made for the purpose of describing the general principles of the present disclosure. The scope of the present disclosure should be determined with reference to the claims. And although described with reference to the manufacture and coating of 3-D TFSS, a person skilled in the art could apply the principles discussed herein to the manufacture and coating of any multi-dimensional substrate.

Preferred embodiments of the present disclosure are illustrated in the drawings, like numbers being used to refer to like and corresponding parts of the various drawings. The innovative 3-D TFSS substrate designs and technologies of the current disclosure are based on the use of a three-dimensional (3-D), self-supporting, semiconductor thin film, deposited on and released from a reusable crystalline (embodiments include monocrystalline or multicrystalline silicon) semiconductor template, and methods for selectively coating the top surfaces or ridges of the 3-D TFSS.

A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials such as germanium, silicon germanium, silicon carbide, a crystalline compound semiconductor, or a combination thereof. Additional applications include copper indium gallium selenide (CIGS) and cadmium telluride semiconductor thin films.

Further, selective coating methods disclosed are designed to coat only the top surfaces and ridges of a 3-D TFSS substrate and eliminate or minimize liquid coating material from wicking into substrate surface cavities. In particular, these methods are applicable to selectively coating the top surfaces or ridges of the 3-D TFSS substrate with a liquid dopant or metallization layer as well as applying liquid etchant for selective etching of dielectrics (e.g., oxide and/or solid dopant source layer) from the top and/or rear hexagonal prism ridges.

Although the coating technologies and methods of this disclosure are described to selectively coat the 3-D features of a 3-D TFSS with a liquid coating material, these methods are applicable to a 3-D substrate having any surface design topography. Additionally, in this disclosure the term coating includes but is not limited to depositing, plating, and etching (using an etchant coating) a thin material layer on the top surfaces and ridges of a 3-D TFSS substrate from a liquid phase. As such, the liquid coating materials in this disclosure include depositing, plating, and etching liquid materials as well as modifying pre-existing surface materials. Also, liquid coating materials include but are not limited to liquid dopants, metal-organic liquid metals, inks, glues, photosensitive materials, solvents, and liquids that contain dispersed metal particles. Further, the 3-D features or cavities of substrate in this disclosure include any 3-D surface feature, blind or through holes, vias, buried micro-channels, micro-trenches, and structures that have overhang cavities. These methods may be used to selectively coat, deposit, plate, or etch off a layer of material on the top surface or ridges of a 3-D TFSS substrate.

FIG. 1A shows a top view of hexagonal-prism 3-D TFSS 10 that has been selectively coated on its top surface only with liquid coating material 14. The side and bottom walls of hexagonal 3-D features 12 of hexagonal-prism 3-D TFSS 10 have not been coated.

FIG. 1B shows cross-sectional view of hexagonal-prism 3-D TFSS 16 that has been selectively coated on its top surface only with liquid coating material 14. The side and bottom walls 18 of hexagonal 3-D features of hexagonal-prism 3-D TFSS 16 have not been coated.

FIG. 2A shows a top view of hexagonal-prism 3-D TFSS 20 that has been selectively coated on its top ridges only with liquid coating material 24. A finite vertical portion of the side and bottom walls of hexagonal 3-D features 22 of hexagonal-prism 3-D TFSS 20 have been coated.

FIG. 2B shows a cross-sectional view of hexagonal-prism 3-D TFSS 26 that has been selectively coated on its top ridges only with liquid coating material 24. A finite vertical portion of the side and bottom walls of hexagonal 3-D features 28 of hexagonal-prism 3-D TFSS 26 have been coated and the remainder of the side and bottom walls are uncoated by the coating method. Vertical coated portion of the cavity sidewall 28 may be as small as a few micrometers.

FIG. 3 outlines an exemplary process flow 30 for selectively coating a 3-D substrate with a liquid coating material using a cavity filling method. This method begins with a 3-D substrate 30. Then the micro cavities are either fully or partially filled or covered prior to applying a liquid coating material 34. After the micro cavities have been filled, removing excess filling material exposes the top surfaces or ridges to be coated 36. The exposed surface of the substrate is then coated with a liquid coating material followed by a partial curing of the coating material 37. The partial curing of the coating material results in full or partial solidification of the coating material by baking, driving out the solvents, or curing by exposure of UV, IR or regular light sources. The curing condition should not affect the removability of the filling material. The filling material is then removed from the micro cavities leaving the selected substrate surfaces coated with a liquid coating material 38. Baking then fully cures the coating material, and the process is then complete 39 and ready to begin again.

When filling the 3-D surface micro cavities 34, the filling material may either be a liquid material or a liquid material hardened by a baking or curing process. If the filling material is to remain a liquid during coating, it must be immiscible with the liquid coating material. If the filling material is baked or cured and solidifies before coating, proper selection of the filling material assures that the liquid coating material preferably does not wet the cured filling material surface and that the coating material does not react with the filling material.

Alternatively, a positive tone photoresist material may be used as the filling material in which case the top surfaces to be coated could be exposed after partial UV exposure followed by a resist developing process. The process controls the UV exposure dose so that only the photoresist on top surfaces and ridges is fully exposed and removed in the photoresist developing process. The photoresist in the micro cavities are under exposed so that they could not be fully removed in the resist developing process. As a result, the sidewall and bottom surfaces of the micro cavities are fully covered by the photoresist layer. In yet another embodiment, the photoresist on the top surfaces and ridges may be removed in a photolithography step using an aligned photo mask. In this case, since the photoresist in the micro cavities are not exposed to the UV exposure, it does not need to actually fill the micro cavities—only to cover the sidewall and bottom surfaces.

Filling the micro cavities 34 with filling material may be performed by a variety of methods including immersion, dipping, spraying, volume-controlled dispensing, and spinning. In step 34, the surface cavities of the 3-D substrate may be filled by planarizing the 3-D substrate with a sacrificial layer. The sacrificial filling material is then etched back to expose the top surfaces or ridges to be coated. Removing excess filling material 36 may be performed by squeegeeing, spinning, or etching away excess filling material.

Optionally, the exposed surface of the substrate may be cleaned according to a plasma descum/ashing step after excess filling material has been removed 36.

FIGS. 4A through 4C show an embodiment of a process flow 40, 46, 52 for selectively coating a 3-D substrate using a cavity filling method employing a filling material 44 immiscible with liquid coating material 50. In step 40 in FIG. 4A, the micro cavities of the 3-D substrate 42 are filled with a filling material 44 immiscible with liquid coating material 50 leaving only the surfaces to be coated exposed. Next in step 46 in FIG. 4B, the exposed surfaces of 3-D substrate 48 are coated with liquid coating material 50. After a partial curing of the coating material, then in step 52 in FIG. 4C, liquid filling material 44 is removed from micro cavities 56 of 3-D substrate 54 leaving only the top surface of 3-D substrate 54 coated liquid coating material 50. In the last step, the coating material is fully cured by methods including baking and UV, IR or regular light exposure.

In the first step 40, surface tension may pull the liquid filling material 44 into the micro cavities and the top surfaces and ridges is exposed when excess liquid filling material is removed. In this case, because liquid filling material 44 is immiscible with coating material 50, the coverage of the coating material 50 is self-align with top surfaces or ridges of the micro cavities.

FIGS. 5A through 5C show an embodiment of a process flow 60, 66, 74 for selectively coating a 3-D substrate with a liquid coating material using a cavity filling method. First in step 60 in FIG. 5A, the micro cavities on 3-D substrate 62 are filled with liquid filling material 64 leaving only the surfaces to be coated exposed. Then in step 66 in FIG. 5B, 3-D substrate 68 is coated with liquid coating material 72. Liquid filling material 70 is also coated and covered with liquid coating material 72. The liquid coating material is then partially cured. During this curing process, the adhesion of the coating material to the substrate surfaces is enhanced. Also during the curing process, the filling material may expand and lift off the coating material on its top. Then in step 74 in FIG. 5C, liquid filling material 70 is removed from the surface cavities of 3-D substrate 76 leaving only the top surfaces coated with liquid coating material 78. In the last step, the coating material left on the top and ridges surfaces is fully cured by heat, UV, IR or regular light exposures.

In an alternative embodiment of a process flow shown in FIGS. 5A through 5C for selectively coating a 3-D substrate, filling material 64 is solidified in the micro cavities of 3-D substrate 62 thereby allowing liquid coating material 72 to coat the filling material. In FIG. 5C liquid filling material 70 is able to dissolve in a solvent to lift-off the coated material on top of the cavity openings and leaving only the selected top surfaces or ridges coated.

In the following methods illustrated from FIG. 6 to FIG. 14, the amount of liquid coating material at the coating front is precisely controlled to keep a minimum for only coating the top surfaces and ridges surfaces. Since the liquid amount is limited, the wicking effects are eliminated or significantly reduced. FIG. 6 shows an embodiment of integrated in-line process system 80 for selectively coating a 3-D substrate with liquid coating material 102 by employing liquid transfer coating (LTC) head integrated with an electrostatic chuck 90. An electrostatic chuck is integrated with the flat coating surface of LTC head for clamping and flattening the substrate to be selectively coated over its entire top surface or ridges.

A 3-D substrate is preheated by preheating lamp system 94 which receives power and is controlled by pre-heating lamp power supply and controller 98. Wand 82 transports preheated 3-D substrate 84 to LTC head integrated with an electrostatic chuck 90. 3-D substrate 86 is then selectively coated with liquid coating material 102 transported from liquid reservoir 104 through peripheral liquid flow channels 92 and onto LTC head integrated with an electrostatic chuck 90. Wand 82 then moves selectively coated 3-D substrate 86 over curing lamp system 96 which receives power and is controlled by lamp power supply and controller 100.

The 3-D substrate is moved through integrated in-line process system 80 attached to wand 82 capable holding and releasing the substrate and moving the substrate through the system. Wand 82 may be a vacuum or electrostatic wand.

Preheating lamp system 94 may be comprised of a tungsten-halogen lamp array. 3-D substrate 84 may be rapidly heated to between 50° C. and 250° C. in one to five seconds by preheating lamp system 82. Curing lamp system 96 may also be comprised of a tungsten-halogen lamp array. Liquid coating material 102 on 3-D substrate 88 may be rapidly heated to between 150° C. and 450° C. in one to ten seconds by curing lamp system 82 in order to cure or harden liquid coating material 102 to the selectively coated surfaces of 3-D substrate 88.

In one embodiment of integrated in-line process system 80, while 3-D substrate 84 is being preheated, liquid coating material 102 is first pumped onto the flat surface of LTC head integrated with electrostatic chuck 90. In order to completely cover the flat surface, an excessive amount of liquid coating material 102 may have to be initially delivered to LTC head integrated with an electrostatic chuck 90 through peripheral liquid flow channels 92 until the flat surface is fully covered with liquid coating material 102. Then excess liquid coating material 102 is removed through peripheral liquid flow channels 92 and returned to liquid reservoir 104. In a continuous flow embodiment of integrated in-line process system 80, the level of liquid coating material 102 is constantly maintained at a preset level. In order to maintain a constant level of liquid coating material 102 on the LTC head integrated with an electrostatic chuck 90, the liquid pump-in and pump-out actions may be continuously controlled by a closed loop controller employing a liquid level sensor which monitors the level of liquid coating material 102 on LTC head integrated with an electrostatic chuck 90. The typical thickness of the sheet of liquid coating material 102 on LTC head integrated with an electrostatic chuck is in the range of 5 μm to 50 μm.

FIG. 7 shows an embodiment of a liquid transfer coating (LTC) head design integrated with an electrostatic chuck 110 for selectively coating the top ridges of 3-D substrate 112. LTC head 118 is integrated with an electrostatic chuck connected to and operated by electrostatic chuck power supply and controller 124. Liquid coating material 126 is maintained in liquid reservoir 128 and is transported through peripheral flow holes 114 to cover LTC head 118 in a thin sheet in the typical range of 5 μm to 50 μm. The thin sheet of liquid coating material is maintained and controlled by liquid mass flow controller 122 which pumps liquid coating material in or out of liquid reservoir 128 and is integrated with liquid level displacement sensor 116.

As shown, 3-D substrate 112 is conformally clamped to LTC head 118. This may occur by immersing 3-D substrate 112 in the thin sheet of liquid coating material covering LTC head 118 then activating the electrostatic chuck component integrated with LTC head 118 by electrostatic chuck power supply and controller 124 for a fraction of a second up to a few seconds. The top surfaces or ridges of 3-D substrate 112 then conformally contact the flat surface of LTC head 118 and are fully immersed in the thin sheet liquid coating material on LTC head 118 up to a controlled vertical height determined by the liquid level. The conformal clamping of the electrostatic chuck eliminates any bulking or voids between 3-D substrate 112 and LTC head 118. After a fraction of a second up to a few seconds, 3-D substrate 118 may then be withdrawn with a controlled motion from the thin sheet of liquid coating material on LTC head 118. Due to the small but uniform controlled thickness of liquid coating material 126 on LTC head 118, liquid wicking into the surface micro cavities of 3-D substrate 112 is avoided.

In one embodiment, liquid reservoir 128 is integrated with liquid mass flow controller 122, liquid level displacement sensor 116, and a pumping mechanism which form a real time closed loop system to control the thickness of liquid coating material on LTC head 118 by transporting liquid coating material onto and off of LTC head 118 through peripheral flow holes 114. Liquid level displacement sensor 116 may be an optical or ultrasonic liquid level sensor.

FIG. 8 shows an embodiment of a liquid transfer coating (LTC) head having peripheral liquid transfer holes 130. LTC head 130 comprises a flat surface 132 surrounded by an edge lip 134 capable of maintaining proper liquid level boundary control. Peripheral flow holes 136 for liquid delivery and removal are dispersed around the boundary of LTC head 130.

LTC head 130 consists of a flat surface made of anodized aluminum or stainless steel integrated with an electrostatic chuck. Optionally, the temperature of LTC head 130 may be controlled by a temperature control system integrated with LTC head 130.

FIGS. 9A through 9D show an embodiment of a process flow 140, 150, 160, and 170 for selectively coating a 3-D substrate with a liquid coating material using a micromachined plate having restrictive flow holes 144 to restrict the refreshing flow rate of liquid coating material 146. The top diameter of the restrictive flow holes is in the range of 10 μm to 100 μm and the pitch may be 1.5 to 5 times as large as the top diameter. The depth of the restrictive flow holes is in the range of 100 μm to a few millimeters. The top openings of the restrictive flow holes positioned on micromachined plate having restrictive flow holes 144 provide liquid anchoring effects in keeping a large area thin sheet of liquid coating material 146 in place by having the small top diameter and high densities of the restrictive flow holes. In FIGS. 9A through 9D, liquid coating material 146 in liquid reservoir 148 is kept at a constant positive pressure and liquid sheet thickness H is in the range of 10 μm to 100 μm.

First 140 in FIG. 9A, liquid coating material 146 is pumped through micromachined plate having restrictive flow holes 144 from liquid reservoir 148 by a constant external pumping pressure. In one embodiment, squeegee bar 142 is used to remove excess liquid coating material 146 on micromachined plate having restrictive flow holes 144 in order to provide a uniform sheet of liquid coating material 146 of thickness H. Next 150 in FIG. 9B the top surfaces or ridges of 3-D substrate 152 are immersed/dipped in the thin sheet of liquid coating material 146 having thickness H on micromachined plate having restrictive flow holes 144. The immersion/dipping motion is conducted with precise parallelism, speed and position controls. Next 160 in FIG. 9C, selectively coated 3-D substrate 164 is immediately withdrawn from the thin sheet of liquid coating material 146 having thickness H on micromachined plate having restrictive flow holes 144. The top surfaces or ridges of 3-D substrate 164 are selectively coated with liquid coating material 162. 3-D substrate 164 is then baked or UV/IR cured to solidify the liquid coating material. Since the amount of liquid coating material 162 is minimal, liquid wicking into the surface cavities of 3-D substrate 164 is avoided. Immediately after the withdrawn of the coated substrate, the remaining liquid thickness on the micromachined plate is less than H. After a calibrated time, as shown in FIG. 9D, the thickness of the thin sheet of liquid coating material 146 on micromachined plate having restrictive flow holes 144 returns to H and the process 140, 150, 160, and 170 may be repeated.

FIG. 10 shows an embodiment of a liquid coating system 180 for selectively coating 3-D substrate 182 with liquid coating material 190 using micromachined plate having restrictive flow holes 186 to restrict the refreshing flow rate of thin sheet of liquid coating material 184 having thickness H. 3-D substrate 182 is immersed and withdrawn from thin sheet of liquid coating material 184 with precise parallelism, speed, and position control. When 3-D substrate 182 is immersed in thin sheet of liquid coating material 184, liquid coating material 190 may overflow off micromachined plate having restrictive flow holes 186 and be collected by overflow collector 188. Pumping mechanism 192 pumps liquid coating material 190 through micromachined plate having restrictive flow holes 186 at a constant pressure in order to maintain thin sheet of liquid coating material 184 at thickness H. 3-D substrate 182 may be optionally heated prior to immersion in liquid coating material 190.

FIGS. 11A through 11C show an embodiment of a process flow 200, 210, 220 for selectively coating a 3-D substrate with a liquid coating material using a hard transfer template with a machined recess to serve as a reservoir for controlling the amount of the liquid coating material. In process step 200 in FIG. 11A, a thin sheet of liquid coating material 202 is coated on hard transfer template 204 in a predetermined uniform thickness. In process step 210 in FIG. 11B, the top surfaces or ridges of 3-D substrate 212 are dipped into thin sheet of liquid coating material 214 on hard transfer template 216. Optionally, 3-D substrate 212 may have been heated prior to immersion in thin sheet of liquid coating material 214 to improve interaction with the coating liquid. In process step 220 in FIG. 11C, coated 3-D substrate 222 is selectively coated on its top surfaces 228 and is withdrawn from thin sheet of liquid coating material 224 on hard transfer template 226. Coated 3-D substrate 222 may be optionally baked or cured to harden selectively coated material 228 on its top surfaces. Hard transfer template 226 can be refilled and reused to selectively coat the top surfaces or ridges of another 3-D substrate.

In the embodiment shown, the hard transfer template has a small recess to contain the liquid coating material. In process step 200, hard transfer template 204 is first coated according to conventional coating methods such as spinning, spraying, extrusion, dipping, meniscus coating, and dispensing. In one embodiment, hard transfer template 204 may be partially baked or cured by various conventional methods to partially harden thin sheet of liquid coating material 202.

FIGS. 12A through 12E show an embodiment of a process flow 240, 250, 260 or 240, 270, 280, 290 for selectively coating a 3-D substrate with a liquid coating material using a soft transfer film. In process step 240 in FIG. 12A, soft transfer film 244 is coated with thin sheet of liquid coating material 242 in a predetermined uniform thickness. Next, in process step 250 in FIG. 12B, coated soft transfer film 256 is laminated to 3-D substrate 252 whereby thin sheet of liquid coating material 254 contacts the top surfaces or ridges of 3-D substrate 252. Coated soft transfer film 256 is peeled away from 3-D substrate 252 in process step 260 in FIG. 12C, leaving coated 3-D substrate 262 with liquid coating material selectively coated on its top surfaces 264. This is a self-aligning coating process embodiment. In an alternative process embodiment, in process step 270 in FIG. 12D thin sheet of liquid coating material 274 coats 3-D substrate 272 as a complete sheet after peeling away from coated transfer film 256. This is a typical "tenting" phenomenon of thin film lamination on a non-planar surface. If the viscosity or the solvent content in thin sheet of liquid coating material 274 is properly tuned, a subsequent baking step will cause the coating material to reflow around the top surfaces and ridges to be selectively coated. Since the total amount of the coating liquid transferred to the substrate is limited, after the reflow, only the top surfaces and ridges are coated. Process step 280 in FIG. 12E shows the thin sheet of liquid coating material 274 has self-aligned and selectively coated the top surface 284 of 3-D substrate 282.

Examples of materials that may be used as the soft transfer film include PET film and any film chemically compatible with the liquid coating material. The thickness of the soft transfer film should be in the range of 20 µm to 2 mm.

Optionally, the thin sheet of liquid coating material 242 may be partially dried prior to process step 250. Drying methods include but are not limited to low temperature heating, UV/IR curing, loading in a vacuum chamber or using a convection flow of air or nitrogen. Additionally, the lamination of soft transfer film 256 to 3-D substrate 252 may be completed by conventional lamination steps such as roller or diaphragm lamination. Further, the lamination can be conducted either in an air or vacuum environment depending on the 3-D features of the substrate. 3-D substrate 252 may also be heated prior to lamination to improve adhesion to thin sheet of liquid coating material 254 during lamination.

FIG. 13 shows an embodiment of dual-zone meniscus coating device 300 used for selectively coating 3-D substrate 302 with liquid coating material 312. Liquid coating material is maintained in physically separate environment liquid reservoir 310. Liquid coating material 312 is dispensed from liquid reservoir 310 through nozzle slit 306 positioned on the end of nozzle 308. Top surface coating material 304 is applied in a physically separate environment where heat 314 or assisting drying gas flow 316 dry the liquid coating material 312 before it can wick into the micro cavities of 3-D substrate 302.

Liquid coating material 312 may be dispensed through nozzle slit 306 or a plurality of nozzles with small orifices. Due to the small opening size of nozzle slit 306, the surface tension of the meniscus prevents liquid from flowing out. When the surface of 3-D substrate 302 to be coated is in contact with the meniscus of liquid coating material 312 in nozzle slit 306 the surface tension is reduced and liquid coating material 312 is drawn out of nozzle slit 306 by capillary forces. Concurrently, 3-D substrate 302 slides in a direction relative to nozzle 308.

The relative position between nozzle slit 306 and the surface to be coated on 3-D substrate 302 is a critical element affecting continuous selective coating of a 3-D substrate. One embodiment of the meniscus coating device uses an adjustable nozzle. In this embodiment, constant pressure is applied from the adjustable nozzle to the 3-D substrate surface so that the adjustable nozzle moves in a vertical direction along the contours of the 3-D substrate. In another embodiment of the present disclosure, the nozzle is made of soft and flexible material such as a micromachined polymer. The soft and flexible nozzle is able to bend, stretch, or be compressed according to the 3-D substrate surface. In this way the meniscus in the nozzle opening can maintain continuous contact with the coating surface without causing surface damage.

Temperature is one of the important parameters affecting the properties of liquid coating material 312. By optimizing the independent temperatures of liquid coating material 312 in liquid reservoir 310 and top surface coating material 304 by using heat device 314 wicking effects can be avoided. Further, assisting drying gas flow device 316 helps progress the drying of top surface coating material 304 as it is applied to the top surfaces or ridges of 3-D substrate 302. Similarly, other conditions and parameters such as local heating and UV curing could be independently and timely applied to top surface coating 304 to selectively coat the top surface or ridges of 3-D substrate 302.

FIG. 14 shows angle spray coating device 320 used for selectively coating 3-D substrate 324 with liquid coating material 320. Elongated spray nozzle 328 controls spray angle and spread of liquid coating material 330 deposited on the top surfaces or ridges 326 of 3-D substrate 324. Catch pan 332 collects liquid coating material 330 sprayed but not deposited on 3-D substrate 324 for reuse as recycled liquid coating material 334. Heat source 322 heats 3-D substrate 324 to improve interaction with liquid coating material 330. Optionally, 3-D substrate 324 may hang from belt system during selective coating.

FIG. 15 shows an embodiment of modified screen printing process 340, 350, 360 for selectively coating 3-D substrate 362 with a liquid coating material. In order to prevent the liquid coating material from wicking into the micro cavities of the 3-D substrate, the embodiment of the modified screen printing process consists of (1) using a screen with high screen mesh numbers with the screen opening size closer or smaller than the opening of the micro cavities on the substrate; Alternatively, a flexible thin sheet with rough surface or high density of blind micro via could be used as the screen to soak the coating material; (2) removing the excess liquid coating material from the screen prior to the coating of the substrate; (3) adding an optional pre-heating or partial curing step prior to the screen printing in order to increase the viscosity and/or reduce the volume of the coating material applied on the screen. In 340, excess liquid coating material 342 is minimized by employing fine blade 344 to fully soaked screen material 346 to scrape off and collect excess liquid coating material 342. Step 350 shows an optional heating source applied to fully soaked screen 354 to interaction with 3-D substrate 362. In step 360, 3-D substrate 362 will be selectively coated according to screen printing methods and employing fully soaked screen 364.

The present disclosure has particular application in the fabrication of thin-film solar cells. Accordingly the following FIGS. 16 through 30B present an illustrative method and apparatus of a thin-film solar cell suitable for the disclosed methods and devices for liquid transfer of a coating material. For a more detailed description of the subject matter to which the following FIGS. 16 through 30B pertain, reference is now made to co-pending U.S. patent application Ser. No. 11/868, 489, entitled "METHODS FOR MANUFACTURING THREE-DIMENSIONAL THIN-FILM SOLAR CELLS," (the "'489 application") having common inventors with the present disclosure and which is here expressly incorporated by reference. Note that the following illustrative drawings and explanations derive from the '489 application and, accordingly, not all referenced items in the following figures are explained in complete detail. In the event that explanations for such reference items is desired, reference may be readily made to the '489 application.

FIGS. 16 and 17 show two different process flow embodiments for fabricating hexagonal-prism dual-aperture 3-D TFSS substrates with rear base layers using a suitable template. FIG. 16 depicts an embodiment of a process flow 370 using layer release processing. This flow is based on the use of $Ge_xSi_{1-x}$ sacrificial layer deposition and blanket or selective in-situ-doped epitaxial silicon deposition. The resulting hexagonal-prism unit cells have open apertures on prism top and are terminated at the rear with a rear base layer (in one embodiment, a relatively flat thin silicon layer). Again, the process flow of this embodiment may be easily adjusted in order to use polysilicon, amorphous silicon, or a non-silicon crystalline or polycrystalline/amorphous silicon material. In step 372, a patterned honeycomb-prism template is provided. This template has already been processed to form an embedded array of trenches along with shallower/wider trenches (or trench shoulders) stacked on top of narrower/deeper trenches. There is no dielectric layer on the template frontside, and there is a patterned oxide and/or nitride dielectric layer (or stack) with openings left on the template backside. In step 374, a multi-layer blanket epitaxy is performed in an epitaxial reactor, including the following in-situ process steps. First, $H_2$ bake or $GeH_4/H_2$ bake is used for in-situ surface cleaning. Next, a thin $Ge_xSi_{1-x}$ epitaxial layer is deposited (in one embodiment, on the top only). In one embodiment, this layer is between 10 and 1000 nanometers. Next, a doped silicon epitaxial layer is deposited on the top only. In one embodiment, this layer is p-type, boron-doped and between 1 and 30 microns thick. The in-situ doping (boron doping) profile may be flat or graded. In case of grading, boron doping concentration is gradually increased during the deposition of the silicon epitaxial layer, with a lower concentration at the beginning and a higher concentration towards the end of the epitaxial growth process. This graded base doping may provide a field-assisted drift component for efficient collection of photo-generated carriers, substantially reducing the impact of recombination losses. It also reduces base sheet resistance and ohmic losses. The silicon epitaxial layer thickness is set such that the deep trenches are fully filled with silicon while the shallow (wider) trenches (top trench shoulders) receive epitaxy on their sidewalls and their central regions are left with self-aligned shallow hexagonal troughs. In step 376, the 3-D TFSS substrate is released. A highly selective isotropic wet or dry etch of $Ge_xSi_{1-x}$ is performed, with very high selectivity with respect to silicon. In one embodiment, a mixture of hydrofluoric acid, nitric acid and acetic acid (HNA) is used to selectively etch the $Ge_xSi_{1-x}$ layer. Alternatively, a mixture of ammonia, peroxide, and water ($NH_4OH+H_2O_2+H_2O$) may be used. The wet etchant selectively removes the sacrificial $Ge_xSi_{1-x}$ layer by reaching the sacrificial layer through the template backside dielectric openings. This process releases the hexagonal prism 3-D TFSS substrate, which may then be used for subsequent 3-D TFSS fabrication. Note that the template backside openings may be formed directly in silicon backside without a need for the backside dielectric. Alternatively, the sacrificial $Ge_xSi_{1-x}$ layer may be replace by forming porous $Ge_xSi_{1-x}$ layer or porous silicon layer.

FIG. 17 depicts an embodiment of a process flow 380 for fabrication of self-supporting hexagonal-prism single-aperture 3-D thin-film polysilicon or amorphous silicon TFSS substrates with rear base layers made of polysilicon or amorphous silicon using layer release processing, without the use of epitaxial silicon processing. The amorphous silicon or polysilicon layer may be optionally crystallized using laser crystallization as part of the flow. This process flow uses a dielectric sacrificial layer such as $SiO_2$ (deposited using LPCVD or thermally grown) in conjunction with conformal amorphous silicon or polysilicon deposition for the silicon absorber layer. Step 382 (providing a substrate) corresponds to step 372 in FIG. 16. Step 384 involves depositing a conformal sacrificial layer (or a layer stack). First, a thin layer of a sacrificial material is deposited by conformal layer formation (LPCVD or thermal oxidation). In one embodiment, the sacrificial material is $SiO_2$, with a thickness of between 50 and 2000 nanometers. This sacrificial oxide layer conformally covers the hexagonal-prism trench walls and the template frontside. If subsequent laser crystallization is used, step 384 also includes depositing a thin nitride layer by LPCVD. In one embodiment, this nitride layer is $Si_3N_4$, with a thickness between 100 and 1000 nanometers. The sacrificial layer may be made of porous silicon instead of oxide and/or nitride. Step 386 involves deposition of a blanket silicon layer using conformal deposition. In one embodiment, this blanket silicon layer may be amorphous silicon or polysilicon, p-type in-situ doped with boron, having a thickness between 1 and 30 microns. Note that the silicon thickness is set such that the deep trenches are fully filled with silicon while the shallow (wider) near-surface trenches receive silicon on sidewalls, and their central regions are left with self-aligned relatively shallow hexagonal troughs or trenches. Step 388 involves depositing an optional thin silicon nitride dielectric layer on top by LPCVD or PECVD to serve as a protective cap for silicon layer. In one embodiment, this layer is between 100 and 1000 nanometers. Step 390 involves 3-D TFSS substrate release. In one embodiment and when using a silicon dioxide sacrificial layer, hydrofluoric acid (HF) is used to etch the oxide sacrificial layer. In another embodiment and when using a porous silicon sacrificial layer, a mixture of ammonia, peroxide, and water ($NH_4OH+H_2O_2+H_2O$) or a mixture of hydrogen peroxide and hydrofluoric acid ($H_2O_2+HF$) or a suitable composition of tri-methyl-ammonium-hydroxide (TMAH) may be used. The etch composition and temperature may be adjusted to achieve maximum etch selectivity for porous silicon with respect to silicon. This process releases the hexagonal-prism 3-D TFSS substrate. Note that the wet etchant selectively removes the sacrificial $Ge_xSi_{1-x}$ layer (or porous silicon sacrificial layer) by reaching the sacrificial layer through the template backside dielectric openings (note that backside openings may be formed directly in the template substrate backside without using any dielectric on the template backside). This process releases the hexagonal-prism 3-D TFSS substrate from the template. An optional step 392 involves laser crystallization of the released 3-D thin-film amorphous silicon or polysilicon substrate to form a large-grain polysilicon microstructure. The silicon nitride layer surrounding silicon serves as protective cap. The nitride layer is then selectively stripped. The hexagonal-prism 3-D TFSS substrate may then be used for subsequent 3-D TFSS fabrication.

FIG. 18 shows an embodiment of a process flow 400 for fabrication of self-supporting (free standing) hexagonal-prism 3-D TFSS substrates using layer release processing. This process flow results in dual-aperture hexagonal-prism 3-D TFSS substrates with hexagonal prisms with open apertures formed on both the top and rear (there is no rear base layer). In step 402, a patterned hexagonal-prism (or another prism array) template is provided. This template has already been processed to form an embedded array of deep hexagonal-prism trenches. There is a patterned dielectric (oxide and/ or nitride) hard mask on the template top and rear surfaces. Step 404 involves a multi-layer blanket epitaxial semiconductor deposition in an epitaxial growth reactor. Step 404 first involves an $H_2$ or $GeH_4/H_2$ in-situ bake cleaning, which is performed after a standard pre-epitaxial wet clean (the latter if necessary). Next, a thin sacrificial epitaxial layer is deposited on the frontside only. In one embodiment, $Ge_xSi_{1-x}$ is used for the sacrificial epitaxial layer and is between 10 and 2000 nanometers (in another embodiment a layer of porous silicon is directly deposited for the sacrificial layer). Next, a doped monocrystalline silicon epitaxial layer is deposited (in one embodiment, on the frontside only). In one embodiment, the layer is p-type, boron-doped and has a thickness between 1 and 30 microns. Step 406 involves selective silicon etch to selectively strip the top silicon layer, stopping on the sacrificial layer. First, the top silicon layer is removed using a selective (wet or dry) silicon etch process until the top $Ge_xSi_{1-x}$ epitaxial layer (or porous silicon) or oxide/nitride hard mask is exposed. When using a plasma (dry) etch process, one embodiment uses optical end-point detection to ensure complete removal of the top silicon layer and exposure of the top sacrificial ($Ge_xSi_{1-x}$ or porous silicon) layer. Step 1908 involves 3-D TFSS substrate release using a selective etchant to etch the sacrificial layer. A highly selective isotropic (in one embodiment, wet) etch of $Ge_xSi_{1-x}$ is performed, with very high selectivity with respect to silicon (in one embodiment, with etch selectivity much better than 100:1). In one embodiment, a mixture of hydrofluoric acid, nitric acid and acetic acid (HNA) is used to etch the sacrificial $Ge_xSi_{1-x}$ layer (etchants such as $H_2O_2+H_2O$ or TMAH may be used to selectively etch porous silicon). Alternatively, a mixture of ammonia, peroxide, and water ($NH_4OH+H_2O_2+H_2O$) may be used. This process releases the crystalline silicon layer as a hexagonal-prism 3-D TFSS substrate, which may then be used for subsequent 3-D TFSS fabrication.

Figure 19:
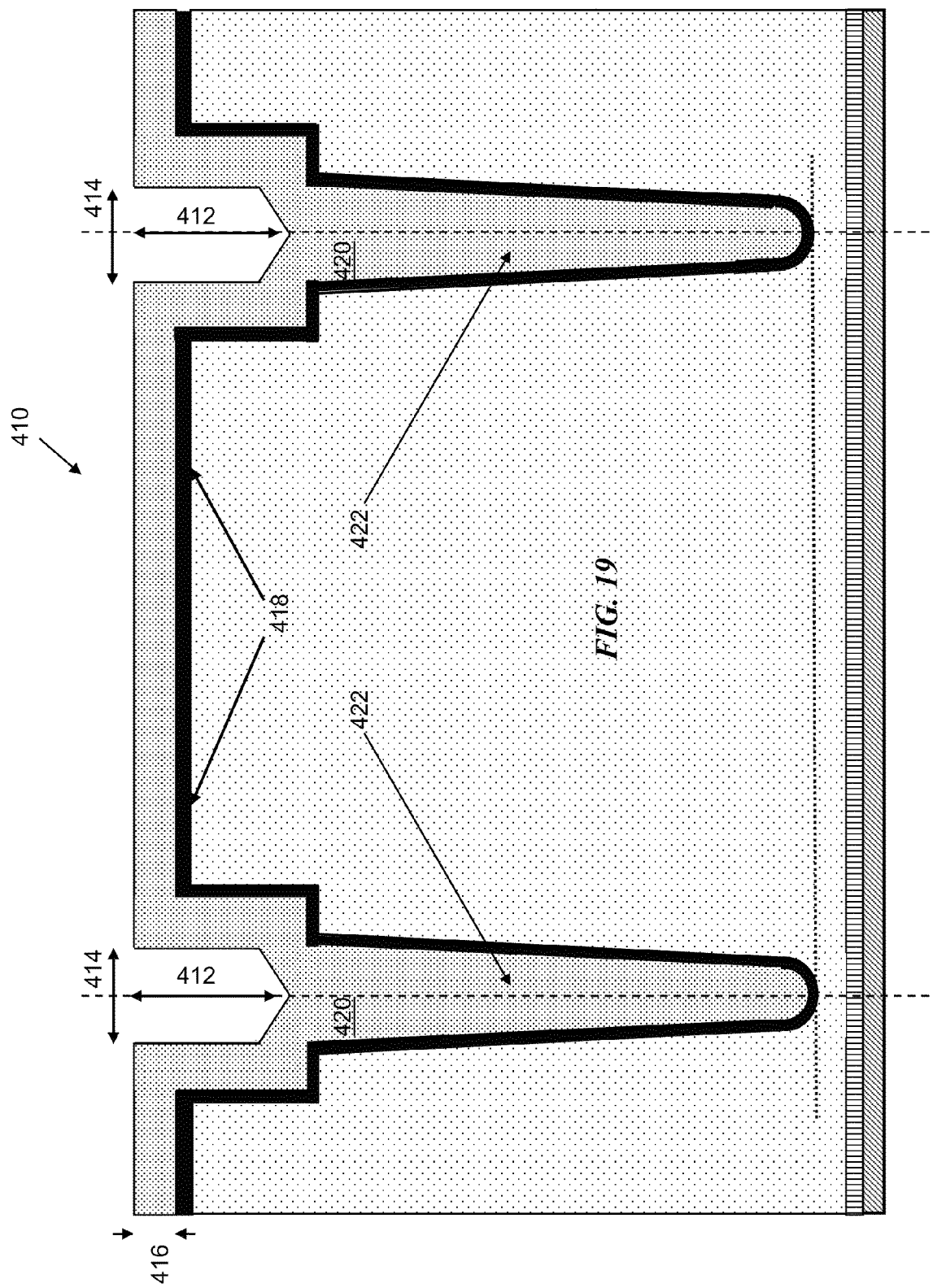

FIG. 19 shows a view 410 after deposition of the thin (e.g., 200 to 2000 nanometers thick) sacrificial layer 418 (epitaxial $Ge_xSi_{1-x}$ or porous silicon or another suitable material) and the in-situ-doped (boron-doped for p-type base) epitaxial silicon layer 420. The epitaxial silicon deposition process fills the trenches (void-free trench fill) while leaving relatively shallow troughs (trenches 422) near the top. This may be done by stopping the epitaxial deposition process after the deeper/narrower trenches are fully filled with epitaxial silicon and before filling of the wider/shallower trenches on the template frontside (thus, forming the shallower troughs with height (L) 412 and width ($W_m$) 414 in conjunction with the top epitaxial silicon layer of thickness ($W_f$) 416.

Figure 20:
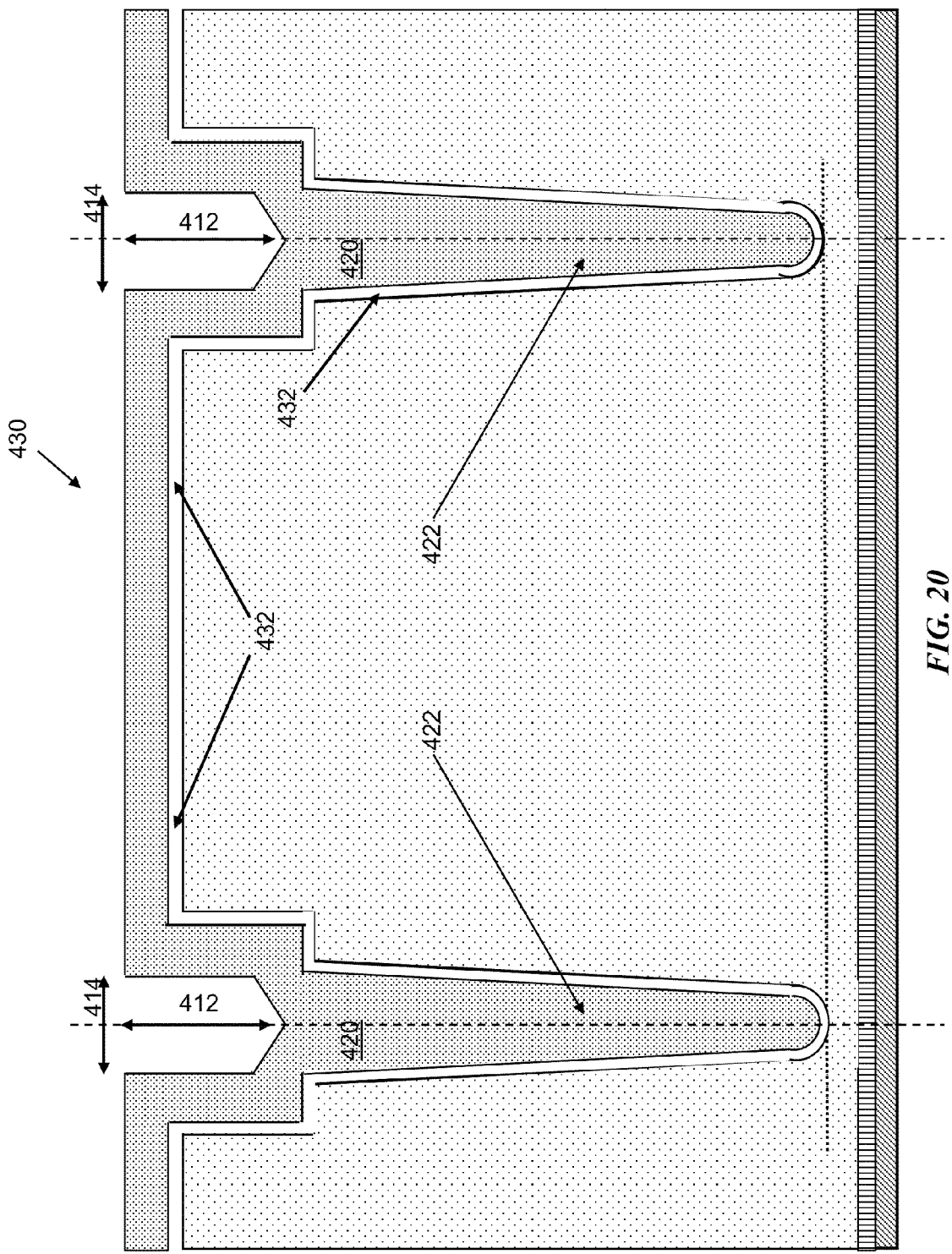
Figure 21:
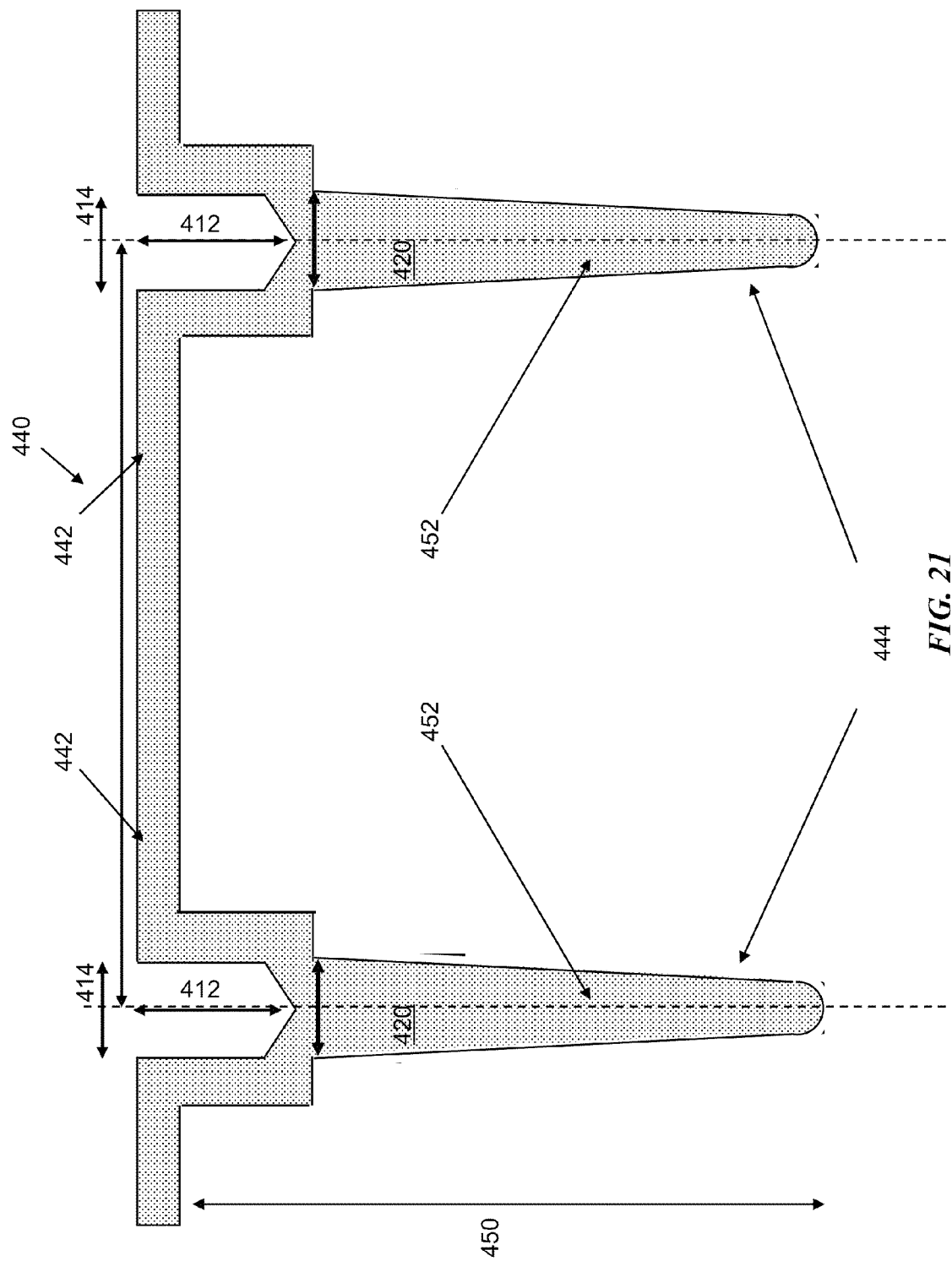
Figure 22:
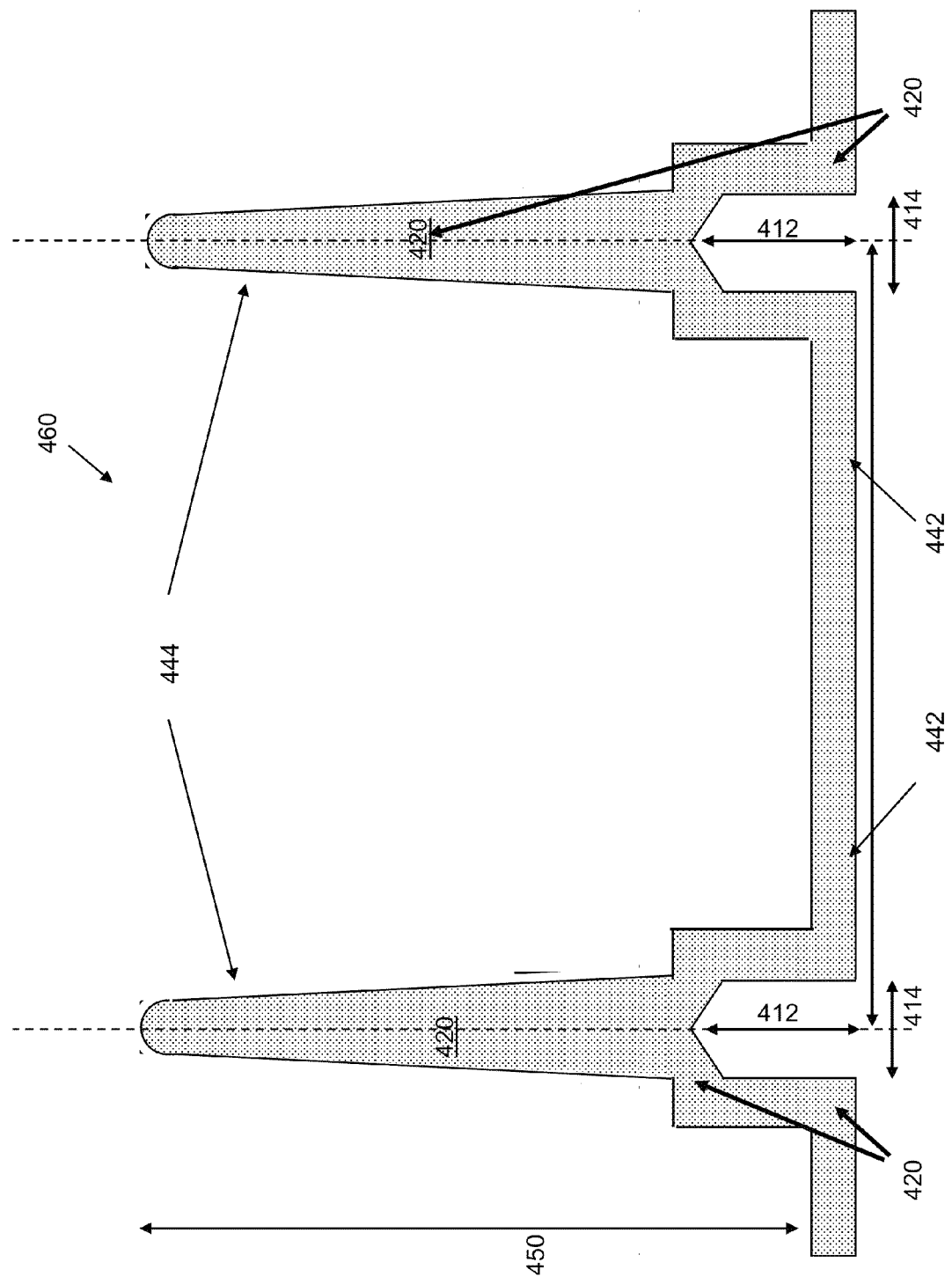
Figure 23:
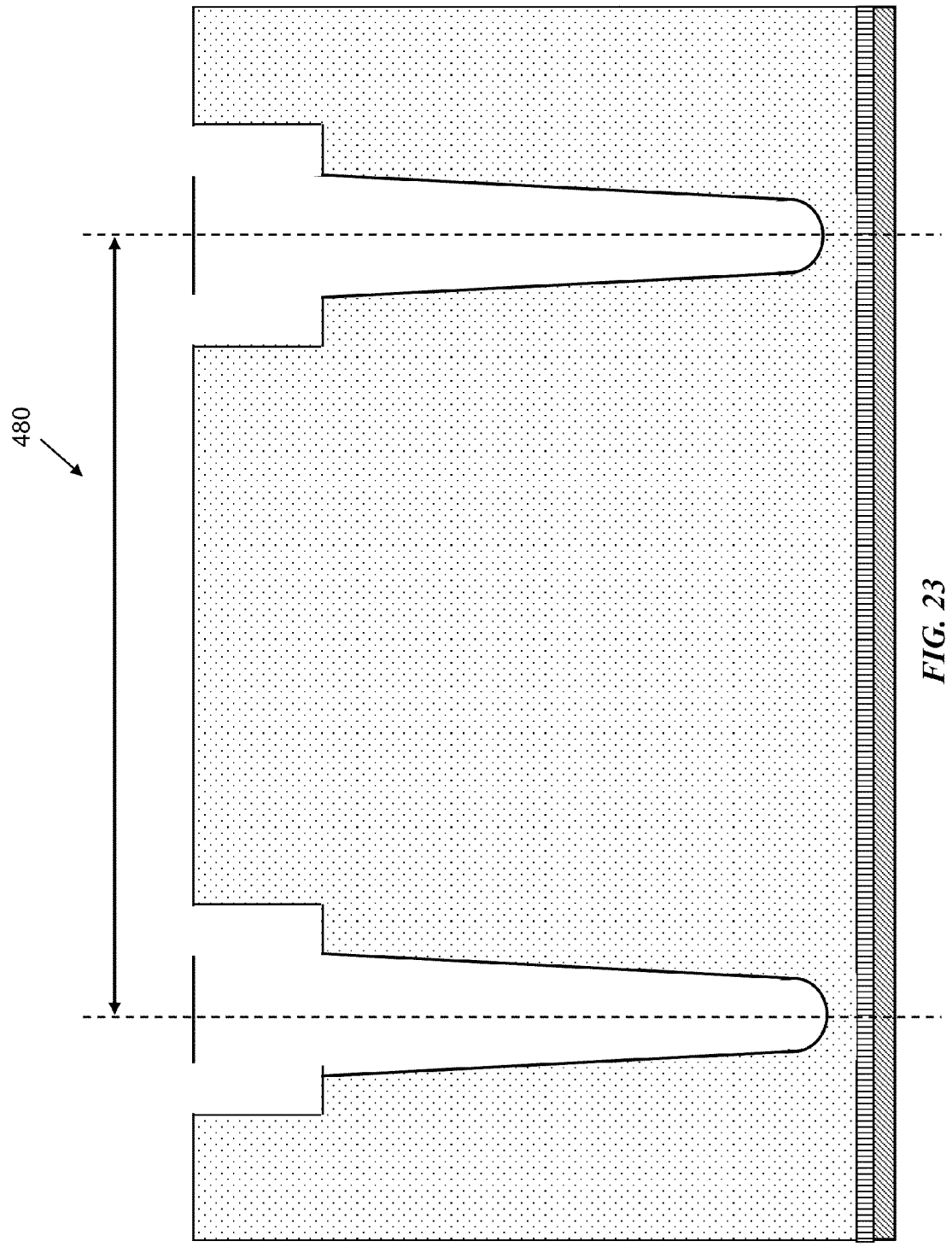

FIG. 20 shows a view 430 of the template in FIG. 19 after highly selective etching of the sacrificial layer 418, thus allowing for release and removal of the 3-D TFSS substrate 420 from the template. FIGS. 21 and 23 illustrate Y-Y cross-sectional views 440 and 480 of the released substrate 420 from FIG. 20. The released substrate 420 has a base side 442, an emitter side 444. The substrate 420 has dimensions of $T_{st}$ (silicon sidewall thickness near the base side of the hexagonal-prism vertical sidewalls), $T_{sb}$ (silicon sidewall thickness near the emitter side of the hexagonal-prism vertical sidewalls), hexagonal-prism height 450, and tapered hexagonal-prism TFSS substrate sidewalls 452. Referring to the view 460 in FIG. 21, the base side 442 is shown on the top and the emitter side 444 is shown on the bottom (TFSS substrate as released from the template). In the view 460 in FIG. 22, the base side 442 is shown on the bottom and the emitter side 444 is shown on the top. FIG. 23 shows a Y-Y cross-sectional view 480 of the template shown in FIG. 20 after releasing and separating/removing the embedded hexagonal-prism single-aperture 3-D TFSS substrate with a rear base layer. Template 480 is ready for multiple reuse cycles.

Figure 24B:
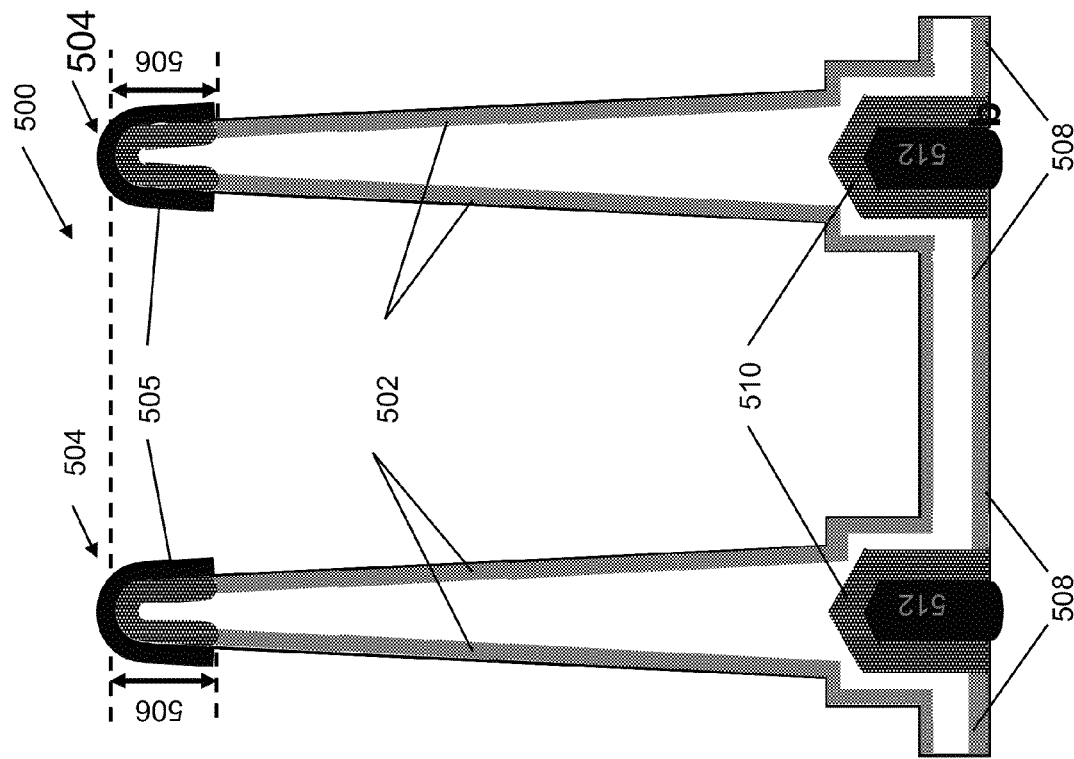
Figure 24A:
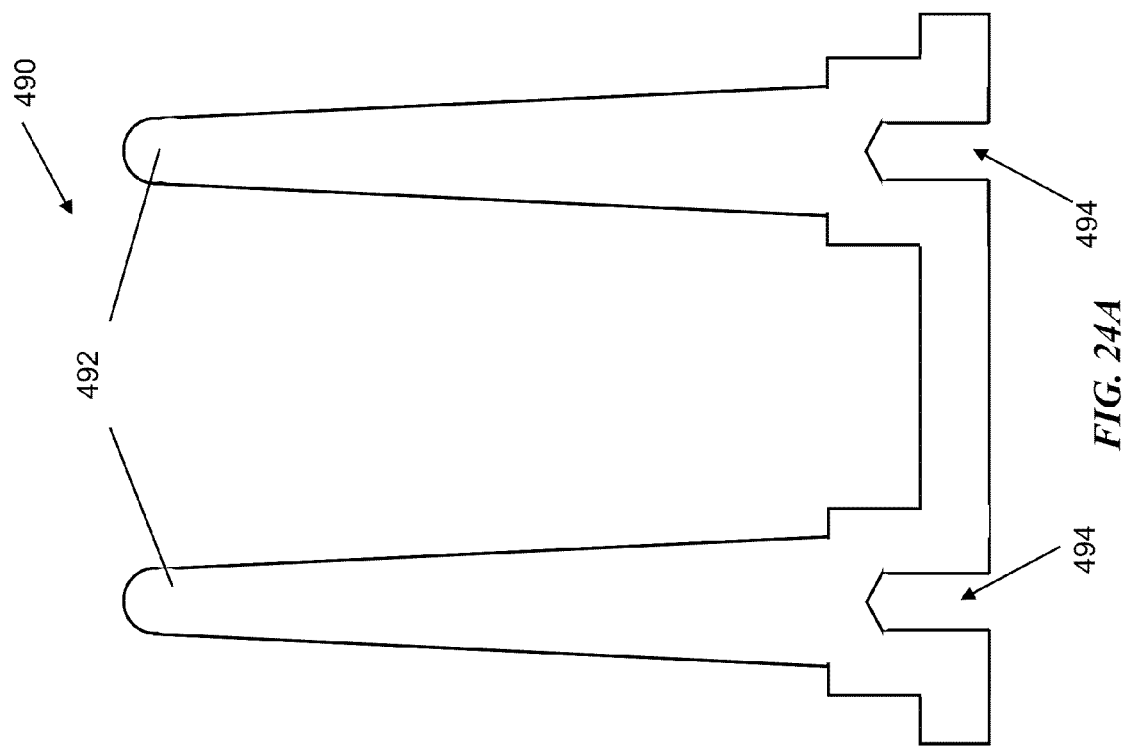

FIG. 24A shows a Y-Y cross-sectional view 510 of a unit cell within a single-aperture hexagonal-prism 3-D TFSS substrate with a rear base layer (released and removed from its template) before cell fabrication. For subsequent $n^+p$ selective emitter formation, the hexagonal-prism sidewalls are in-situ-doped with boron to form the base region at the time of 3-D TFSS substrate fabrication. The sidewalls are doped with boron (in one embodiment, at the time of silicon deposition into the template), either uniformly or in a graded profile, more lightly doped at the prism sidewall surface and more heavily doped towards the sidewall vertical center axis. Similarly, the hexagonal-prism rear base layer is in-situ-doped at the time of 3-D TFSS substrate fabrication. The base layer is doped with boron, either uniformly or in a graded profile, more lightly doped at the rear base layer top surface and more heavily doped towards the rear base layer rear surface, creating a built-in back-surface-field effect in the rear base layer, improving the cell performance. The prism top (emitter side) ridges 512 are used for emitter contact diffusion and metal contact formation and the hexagonal troughs 494 for base contact diffusion and buried metal contact formation.

FIG. 24B shows a Y-Y cross-sectional view 520 of a unit cell within the hexagonal prism 3-D TFSS of this disclosure (using the hexagonal prism 3-D TFSS substrate with a rear base layer as shown in FIG. 24A) after self-aligned formation of: selective emitter regions 502 (e.g., less heavily-doped with phosphorus, n$^+$ selective emitter on the hexagonal prism sidewall surfaces as shown); heavily-doped emitter contact regions 504 with coverage height L$_e$ 506 (e.g., more heavily-doped with phosphorus, n$^{++}$ doped emitter contact regions on the hexagonal prism top hexagonal ridges as shown); selective base regions 508 on the rear surface of the rear base layer (e.g., less heavily-doped with boron, p$^+$ selective base on the rear base layer rear surface as shown); and heavily-doped (boron-doped p$^{++}$) base contact diffusion regions 510 in the rear base layer trenches/troughs (e.g., more heavily-doped with boron, p$^{++}$ doped base contact regions). The cured solid dopant source layers for emitter 505 and base regions 512 are shown as dark segments on the top hexagonal-prism ridges and within the rear base rear filled trenches (troughs), respectively.

FIG. 25A shows a Y-Y cross-sectional view 520 after the cured n-type and p-type dopant layers have been removed and before the thermal diffusion process. FIG. 25B shows a Y-Y cross-sectional view 530 after formation of surface passivation and anti-reflection coating (thermal SiO$_2$ and/or PVD or PECVD SiN$_x$ or AlN$_x$ ARC) dielectric layers 532. Note L$_e$ 534 and cured boron doped glass 536. FIG. 26A shows a Y-Y cross-sectional view 540 after formation of emitter 542 and base 544 contact metals (silver, aluminum, copper, etc.) by fire-through and/or selective plating. FIG. 26B shows a Y-Y cross-sectional view 550 after the addition of a detached highly reflective rear specular or diffuse mirror 552 (e.g., silver or aluminum coating on a base interconnect plane on a PCB in the solar module assembly; the mirror may contact the rear base contacts as shown).

FIG. 27 shows a view 560 of a template with hexagonal-prism posts (pillars) 562. A hexagonal-prism 3-D TFSS substrate (not shown) is fabricated by first forming a suitable relatively conformal thin sacrificial layer (in one embodiment, porous silicon) on the template, then filling in the relatively deep trenches 564 between hexagonal-prism posts 562, and subsequently releasing the hexagonal prism 3-D TFSS substrate by selectively etching the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

FIG. 28 shows a view 570 of a template with hexagonal-prism posts (pillars) 572. A hexagonal-prism 3-D TFSS substrate (not shown) is fabricated by first forming a suitable relatively conformal thin sacrificial layer (in one embodiment, porous silicon) on the template, then filling in the relatively deep trenches 574 between hexagonal-prism posts 572, and subsequently releasing the hexagonal prism 3-D TFSS substrate by selectively etching the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

FIG. 29 shows a 3-D view 580 of multiple adjacent prism unit cells from a regular hexagonal prism TFSS of this disclosure, after cell fabrication, including self-aligned base and emitter contact metallization. The dark region on the top 582 of the unit cell is the self-aligned emitter contact metal; the rear 584 of the unit cell is the self-aligned base contact metal. The prism sidewall surfaces are doped to form the selective emitter junctions (e.g., shallow n$^+$p junctions with a junction depth of 0.2 to 0.5 micron in boron-doped silicon base).

FIG. 30A shows a quasi 3-D view 590 of a single unit cell from a regular dual-aperture hexagonal-prism TFSS of this disclosure (shown for the cell without a rear base layer), before self-aligned base and emitter contact metallization. The prism sidewall surfaces are doped to form the selective emitter junctions (e.g., n$^+$p junctions in boron-doped silicon base). FIG. 30A shows top hexagonal opening 594, which may form the frontside self-aligned emitter metallization contacts 592; and rear (bottom) hexagonal opening 596, which may form the rear selective base self-aligned contacts 594.

FIG. 30B shows a quasi 3-D view 600 of a single unit cell from a regular hexagonal prism TFSS of this disclosure, after cell fabrication, including self-aligned base and emitter contact metallization. The dark region on the top of the unit cell is the self-aligned emitter contact metal 602; the rear of the unit cell is the self-aligned base contact metal 606. The prism sidewall surfaces are doped to form the selective emitter junctions (e.g., shallow n$^+$p junctions with a junction depth of 0.2 to 0.5 micron in boron-doped silicon base). One embodiment of the present disclosure utilizes a screen printing material having mesh openings less than 10 µm in diameter. The mesh openings must be smaller than the openings of the micro cavities on the 3-D substrate or capillary forces generated by the micro cavities on the 3-D substrate will pull the liquid coating material in. Alternatively, a continuous flexible thin sheet that has a rough surface may be used as a screen printing material.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for selectively coating three-dimensional features on a substrate, comprising the steps of:
   forming a substrate comprising at least the steps of:
      forming a sacrificial layer on a template;
      subsequently depositing a semiconductor layer on said sacrificial layer;
      and
      releasing said semiconductor layer from said template along said sacrificial layer;
   coating three-dimensional features on said substrate using a liquid transfer coating step for applying a liquid coating material to a predetermined surface of said three-dimensional features on said substrate, comprising at least the steps of:
      maintaining a thin sheet of liquid coating material on a plate, comprising at least the steps of:
         providing a plate having restrictive flow holes to restrict the refreshing flow rate of liquid coating material and capable of anchoring a thin sheet of liquid coating material in place;
         positioning said plate on a reservoir of liquid coating material under constant pressure; and controlling the volume of said thin sheet of liquid coating material according to the transfer of liquid coating material from said liquid coating material reservoir to said thin sheet of liquid coating material on said plate through said restrictive flow holes;

contacting the substrate surface to be coated with said thin sheet of liquid coating material on said plate.

2. The method for selectively coating three-dimensional features on a substrate of claim 1, wherein said restrictive flow holes are micromachined restrictive flow holes.

3. The method for selectively coating three-dimensional features on a substrate of claim 1, wherein said thin sheet of liquid coating material on said plate has a thickness less than 100 μm.

4. The method for selectively coating three-dimensional features on a substrate of claim 1, wherein said restrictive flow holes have a top diameter less than 100 μm.

5. The method for selectively coating three-dimensional features on a substrate of claim 1, further comprising:
removing said substrate from said thin sheet of liquid coating material; and
curing the coating material on the substrate.

6. The method for selectively coating three-dimensional features on a substrate of claim 1, further comprising removing excess liquid coating material on said plate using a squeegee.

7. The method for selectively coating three-dimensional features on a substrate of claim 1, wherein said substrate is a silicon substrate.

8. The method for selectively coating three-dimensional features on a substrate of claim 1, wherein said liquid coating material is a dopant.

9. The method for selectively coating three-dimensional features on a substrate of claim 1, wherein said liquid coating material is a metallization material.

10. The method for selectively coating three-dimensional features on a substrate of claim 1, wherein said liquid coating material is an etchant.

11. A method for selectively coating three-dimensional features on a substrate, comprising the steps of:
forming a substrate comprising at least the steps of:
forming a sacrificial layer on a template;
subsequently depositing a semiconductor layer on said sacrificial layer; and
releasing said semiconductor layer from said template along said sacrificial layer;
coating three-dimensional features on said substrate using a liquid transfer coating step for applying a liquid coating material to a predetermined surface of said three-dimensional features on said substrate, comprising at least the steps of:
providing a reservoir of a liquid coating material associated with a nozzle, said nozzle having an opening capable of preventing said liquid coating material from flowing out; and
contacting the substrate surface to be coated with the meniscus of liquid coating material at said nozzle.

12. The method for selectively coating three-dimensional features on a substrate of claim 11, wherein said step of providing a reservoir of a liquid coating material associated with a nozzle comprises the step of controlling said liquid coating material in said reservoir at a specified temperature.

13. The method for selectively coating three-dimensional features on a substrate of claim 11, wherein said step of contacting the substrate surface to be coated with the meniscus of liquid coating material at said nozzle comprises the step of locally drying said liquid coating material according to an air or gas flow or according to a heating or UV curing device.

14. The method for selectively coating three-dimensional features on a substrate of claim 11, wherein said nozzle is a vertically adjustable nozzle.

15. The method for selectively coating three-dimensional features on a substrate of claim 11, wherein said nozzle is a soft flexible nozzle.

16. The method for selectively coating three-dimensional features on a substrate of claim 11, further comprising curing the coating material on the substrate.

17. The method for selectively coating three-dimensional features on a substrate of claim 11, wherein said substrate is a silicon substrate.

18. The method for selectively coating three-dimensional features on a substrate of claim 11, wherein said liquid coating material is a dopant.

19. The method for selectively coating three-dimensional features on a substrate of claim 11, wherein said liquid coating material is a metallization material.

20. The method for selectively coating three-dimensional features on a substrate of claim 11, wherein said liquid coating material is an etchant.

* * * * *